United States Patent [19]
Sukegawa

[11] Patent Number: 5,812,814
[45] Date of Patent: Sep. 22, 1998

[54] ALTERNATIVE FLASH EEPROM SEMICONDUCTOR MEMORY SYSTEM

[75] Inventor: Hiroshi Sukegawa, Tokyo, Japan

[73] Assignee: Kabushiki Kaisha Toshiba, Kanagawa-ken, Japan

[21] Appl. No.: 200,968

[22] Filed: Feb. 24, 1994

[30] Foreign Application Priority Data

| Feb. 26, 1993 | [JP] | Japan | 5-038112 |
| Jul. 14, 1993 | [JP] | Japan | 5-173987 |
| Oct. 22, 1993 | [JP] | Japan | 5-264725 |

[51] Int. Cl.⁶ ..................... G06F 12/16
[52] U.S. Cl. ............... 395/430; 395/DIG. 1; 395/405; 395/493
[58] Field of Search ............. 395/413, 416, 395/428, 430, 405, 493

[56] References Cited

U.S. PATENT DOCUMENTS

| 5,113,512 | 5/1992 | Miki et al. | 395/416 |
| 5,136,711 | 8/1992 | Hugard et al. | 395/700 |
| 5,365,486 | 11/1994 | Schreck | 365/222 |
| 5,375,222 | 12/1994 | Robinson et al. | 395/430 |
| 5,430,857 | 7/1995 | Kendall | 395/416 |

FOREIGN PATENT DOCUMENTS

| 477503A2 | 4/1992 | European Pat. Off. . |
| 528280A1 | 2/1993 | European Pat. Off. . |
| 62-283496 | 12/1987 | Japan . |
| 4283825 | 8/1992 | Japan . |

OTHER PUBLICATIONS

Wells, et al., Flash Solid–State Drive with 6MB/s Read Write channel and Data Compression, Feb., 1993, pp. 52–53.

"82077AA CHMOS Single–Chip Floppy Disk Controller", Intel Peripheral Components, pp. 4–1 to 4–62 (1993).

*Primary Examiner*—Reba I. Elmore
*Attorney, Agent, or Firm*—Finnegan, Henderson, Farabow, Garrett & Dunner, L.L.P.

[57] ABSTRACT

A semiconductor memory system including a flash EEPROM comprises a first flash EEPROM included in the first memory drive, a second flash EEPROM included in the second memory drive, and means for controlling access to the first and second flash EEPROMs. The access controlling means includes an address converting means for converting a logical address from a host system into a physical address, according to first and second file management information which indicates correspondence between logical addresses and physical addresses of the first and second memory drives, respectively. The access controlling means further includes memory accessing means, coupled to each of the first and second flash EEPROMs, for accessing a selected EEPROM according to the physical address from the address converting means.

22 Claims, 19 Drawing Sheets

| LOGICAL ADDRESS | | | | PHYSICAL ADDRESS | |
| --- | --- | --- | --- | --- | --- |
| DRIVE Nr. | CYLINDER | HEAD | SECTOR | CHIP Nr. | MEMORY ADDRESS |
| # 0 | | | 1 | # 1 | |
| # 0 | | | 2 | # 1 | |
| ⋮ | ⋮ | ⋮ | ⋮ | | |
| # 0 | | | | # 1 | |
| # 0 | | | | # 2 | |
| ⋮ | ⋮ | ⋮ | ⋮ | | |
| # 0 | | | | # 2 | |
| # 0 | | | | # 3 | |
| ⋮ | ⋮ | ⋮ | ⋮ | | |
| # 0 | | | n | # 3 | |
| # 1 | | | 0 | # 4 | |
| # 1 | | | 1 | # 4 | |
| ⋮ | ⋮ | ⋮ | ⋮ | | |
| # 1 | | | | # 4 | |
| # 1 | | | | # 5 | |
| ⋮ | ⋮ | ⋮ | ⋮ | | |
| # 1 | | | | # 5 | |
| # 1 | | | | # 6 | |
| ⋮ | ⋮ | ⋮ | ⋮ | | |
| # 1 | | | m | # 6 | |

Fig. 1b

ADDRESS CONVESION TABLE

| LOGICAL ADDRESS | | PHYSICAL ADDRESS | |
|---|---|---|---|
| TRACK No. | SECTOR | CHIP No. | MEMORY ADDRESS |
| 1 – L | 0 – n | CE0 → | INTERNAL FLASH EEPROM |
| L+1 – 2L | 0 – n | CE1 → | EXPANSION FLASH EEPROM 1 |
| 2L+1 – 3L | 0 – n | CE2 → | EXPANSION FLASH EEPROM 2 |
| 3L+1 – 4L | 0 – n | CE3 → | EXPANSION FLASH EEPROM 3 |

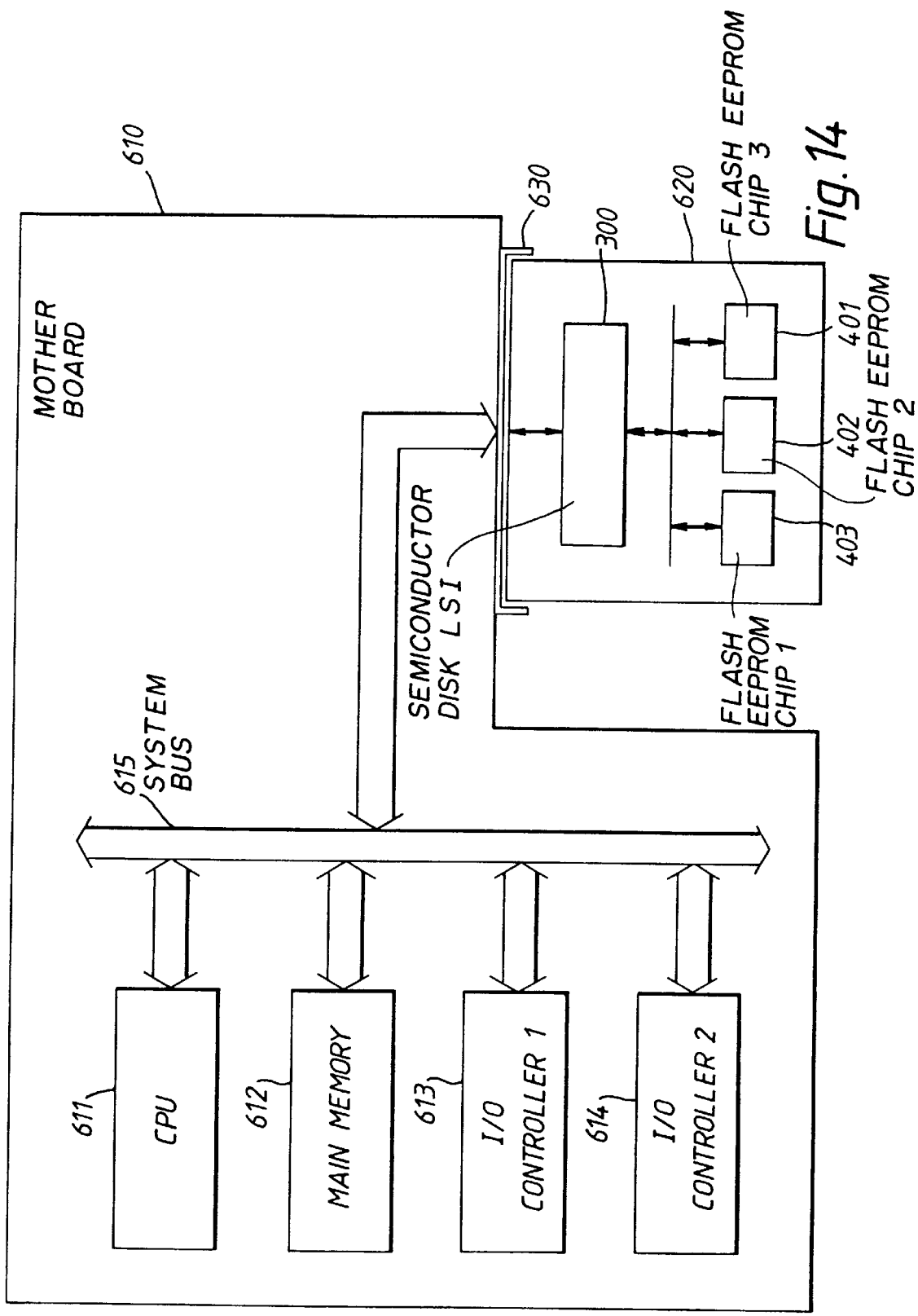

ALTERNATIVE FLASH EEPROM SEMICONDUCTOR MEMORY SYSTEM

BACKGROUND OF THE INVENTION

1. Field of the Invention

The present invention relates to a semiconductor memory system equipped with a flash EEPROM (Electrically Erasable and Programmable Read Only Memory) which is a non-volatile memory that is electrically and collectively erasable and rewritable.

More particularly, this invention relates to a semiconductor memory system that can be miniaturized.

2. Description of the Related Art

Most conventional information processing systems, such as a work station and a personal computer, use a magnetic disk drive as a secondary memory device. The magnetic disk drive has advantages such as high recording reliability and low bit price while having some shortcomings such as its being large and susceptible to physical impact.

The operational principle of magnetic disk drives is to move a magnetic head on a rotating disk to write or read data on or from that disk respectively. The mechanical moving portions, such as the rotatable disk and the magnetic head, may malfunction or may be damaged when a physical shock is applied to the disk drive. Further, the necessity of those mechanical movable portions impedes making the whole drive more compact.

Accordingly, these deficiencies represent a significant problem when loading the magnetic disk drive into a small portable computer, such as a note book type or pen type personal computer.

Today, therefore, there is a need for a semiconductor memory system which is small in size and not susceptible to physical impact. Such a semiconductor memory system usually has a plurality of EEPROM chips. The semiconductor memory system can be used as a secondary memory device instead of a magnetic disk drive. A computer system can use the semiconductor memory system in the same way it accesses the magnetic disk drive. Details of a semiconductor memory system are described in commonly assigned, copending U.S. patent application Ser. No. 001,750.

The semiconductor memory system has several advantages when used with a personal computer.

For example, the size of the semiconductor memory system can be smaller than the size of the magnetic disk drive. However, using a EEPROM chip in the semiconductor memory system is very expensive. Therefore, there is a need for a semiconductor memory system comprised of parts that cost as little as possible.

Another advantage is that the semiconductor memory system is readily adapted to control an EEPROM and is resistant to breakage because it does not include movable parts. However, the cell array of an EEPROM deteriorates slightly with each rewrite (erase and write) operation. Over time, one of the flash EEPROMs in the semiconductor memory system will have some memory blocks which cannot be rewritten by the semiconductor memory system, because dispersion of rewrite times varies widely. Therefore, the semiconductor memory system will need to be able to exchange a unit of an EEPROM chip, when the semiconductor memory system is used as the secondary memory device in a computer, such as a portable type of computer.

SUMMARY OF THE INVENTION

It is an object of the present invention to provide a semiconductor memory system which can achieve miniaturization and low cost by reducing the number of component parts.

It is another object of this invention to provide a semiconductor memory system which can handle the memory area in a semiconductor memory system as two independent memory areas, allowing the memory area in one semiconductor memory system to be accessed by two drive numbers.

It is another object of this invention to provide a semiconductor memory system which can connect one EEPROM chip to the plurality of flash EEPROM chips without influencing file data on other chips.

It is another object of this invention to provide a semiconductor memory system which can exchange one EEPROM chip of the plurality of flash EEPROM chips without influencing file data on other chips.

It is another object of this invention to provide a semiconductor memory system which can achieve a more flexible layout on the mother board of a personal computer.

In accordance with the present invention there is provided a peripheral semiconductor memory system including first and second memory drives. The system comprises a first flash EEPROM included in the first memory drive, a second flash EEPROM included in the second memory drive, and means for controlling access to the first and second flash EEPROMs.

The access controlling means includes an address converting means for converting a logical address from a host system into a physical address. This conversion occurs according to first and second file management information which indicates correspondence between logical addresses and physical addresses of the first and second memory drives, respectively. The access controlling means further includes memory accessing means, coupled to each of the first and second flash EEPROMs, for accessing a selected EEPROM according to the physical address from the address converting means.

Also in accordance with the present invention, there is provided a method of managing a semiconductor memory device as drives managed by a host system, wherein the semiconductor memory device has a plurality of flash EEPROM chips and a controller for controlling the plurality of flash EEPROM chips in response to a request for access from the host system. The method comprises steps of managing at least a first one of the plurality of flash EEPROM chips as included in a memory area of a first drive, in accordance with first file management information which indicates correspondence between logical addresses and physical addresses; managing at least a second one of the plurality of flash EEPROM chips as included in a memory area of a second drive, in accordance with second file management information which indicates correspondence between logical memory addresses and physical memory addresses; and selectively controlling the first and second drives according to a physical memory address from a logical memory address from the host system in accordance with the first file management information and the second file management information.

BRIEF DESCRIPTION OF THE DRAWINGS

Other objects and features of the present invention will be apparent from the following description, in connection with the following figures, of which:

FIG. 1b shows an address conversion table, which is referred by an access controller in the semiconductor memory system as shown in FIG. 1a for converting logical addresses into physical addresses.

FIG. 11 is an address conversion table for an access controller shown in FIG. 9.

FIG. 14 is a block diagram of the host system shown in FIG. 13.

DETAILED DESCRIPTION OF THE PREFERRED EMBODIMENTS

An embodiment of the present invention will be described with reference to the accompanying drawings.

Figures 1, 1A:
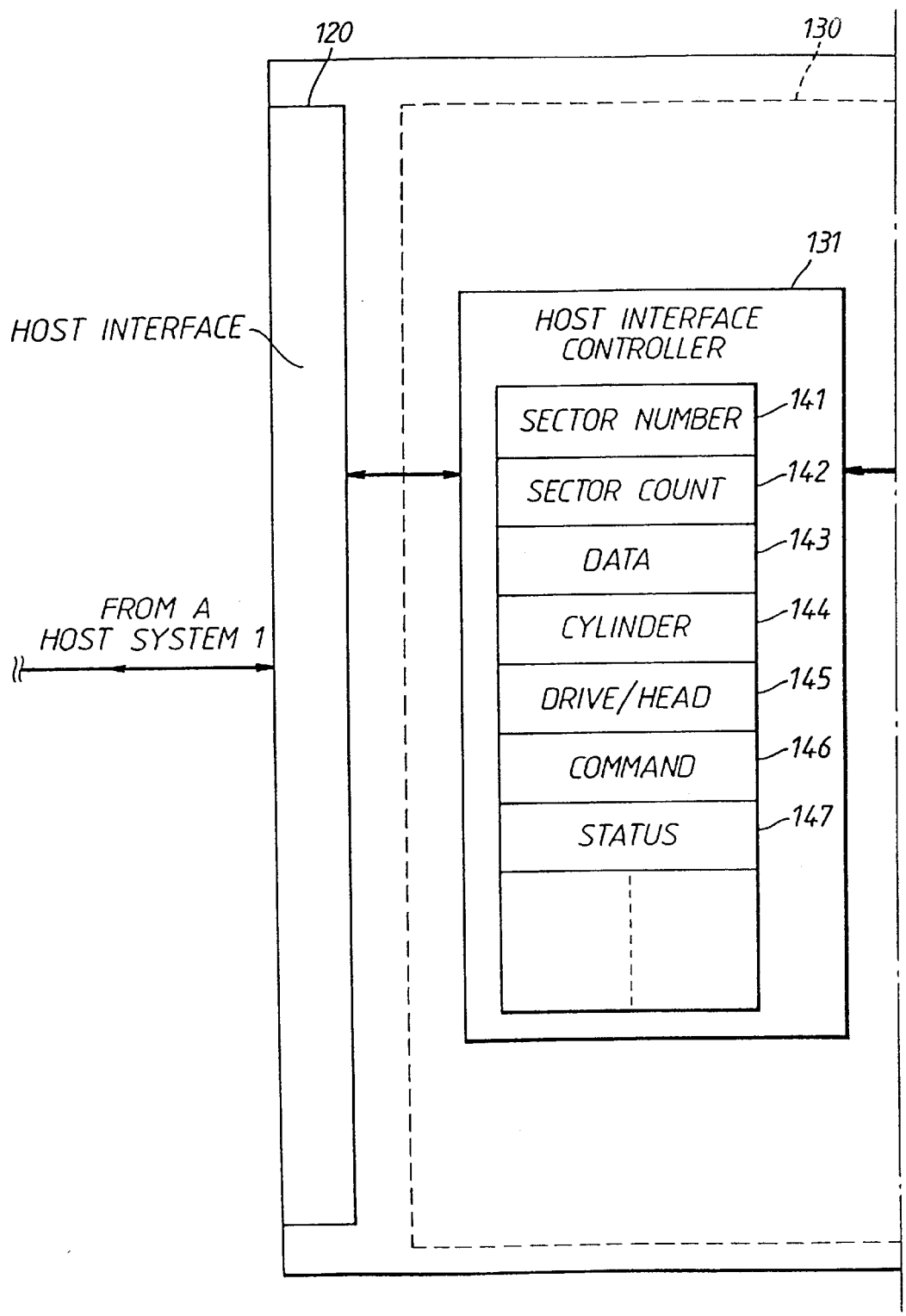
FIG. 1a is a block diagram showing an embodiment of a semiconductor memory system according to the present invention.

FIG. 1a shows a block diagram of a semiconductor memory system according to an embodiment of the present invention.

A semiconductor memory system 100, connected to a personal computer (host system 1), comprises a plurality of flash EEPROM chips 101–106, two IC slots 111 and 112, a host interface 120 and a controller unit 130, and is used as a secondary memory device for the host system in place of a hard disk drive or a floppy disk drive or a memory card, and has a PCMCIA (Personal Computer Memory Card International Association) interface or an IDE (Integrated Drive Electronics) interface, for example.

Each of the flash EEPROM chips 101–106 comprises a cell array and a plurality of peripheral logic functions, such as a row address decoder, for the cell array. Each flash EEPROM chip 101–106 has an input/output (I/O) register, for example structured for 256 bytes. In each flash EEPROM chip 101–106, a minimum unit amount of data handled in a write or an erase operation is determined and the unit amount of data is handled together. For example, it is assumed that the flash EEPROM allows data write operations in pages of 256 bytes and data erase operations in blocks of 4K bytes. In this case, for each of the flash EEPROM chips 101–106, it is preferable to use a Toshiba 16 M-bit NAND flash EEPROM. The flash EEPROM can be accessed by providing an initial memory address of a unit amount of data.

Each of the IC slots 111 and 112 is an expansion slot for expanding a flash EEPROM chip.

The flash EEPROM chips 101–106 and the IC slots 111 and 112 are connected to the controller unit 130 via a common I/O bus and a common read/write control line (R/W). Further, each flash EEPROM chip 101–106 and each IC slot 111 and 112 is independently connected to the controller unit 130 via a chip select signal (each CS 1–8) line and a ready/busy signal (R/B) line.

The host interface 120, like a hard disk drive connectable to a host system, has, for example, a 40-pin arrangement conforming with the IDE interface, or like an IC card installable in an IC card slot, has, for example, a 68-pin arrangement conforming with the PCMCIA interface.

The controller unit 130 comprises a host interface controller 131, an access controller 132 and a DRAM 133.

The host interface controller 131 controls communication between the host interface 120 and the access controller 132, and has several registers, including a sector number register 141, sector count register 142, data register 143, cylinder register 144, drive/head register 145, command register 146 and status register 147. These registers 141–147 are able to be read and be written by the host system 1. The sector number register 141 stores an access head sector number transmitted from the host system 1. The sector count register 142 stores a number of sectors which indicates a sector size of write or read data. The data register 143 stores write data from the host system 1 or read data to the host system 1. The cylinder register 144 stores an access cylinder number transmitted from the host system 1. The drive/head register 145 stores an access drive number and an access head number transmitted from the host system 1. The command register 146 stores a command, such as read or write, transmitted from the host system 1. The status register 147 stores status of the semiconductor memory system 100.

The DRAM 133 has a management area for storing an address conversion table 150, and so on, and a data buffer area for storing write data or read data temporarily.

FIG. 1b shows the address conversion table 150.

Figures 1, 1A, 2:
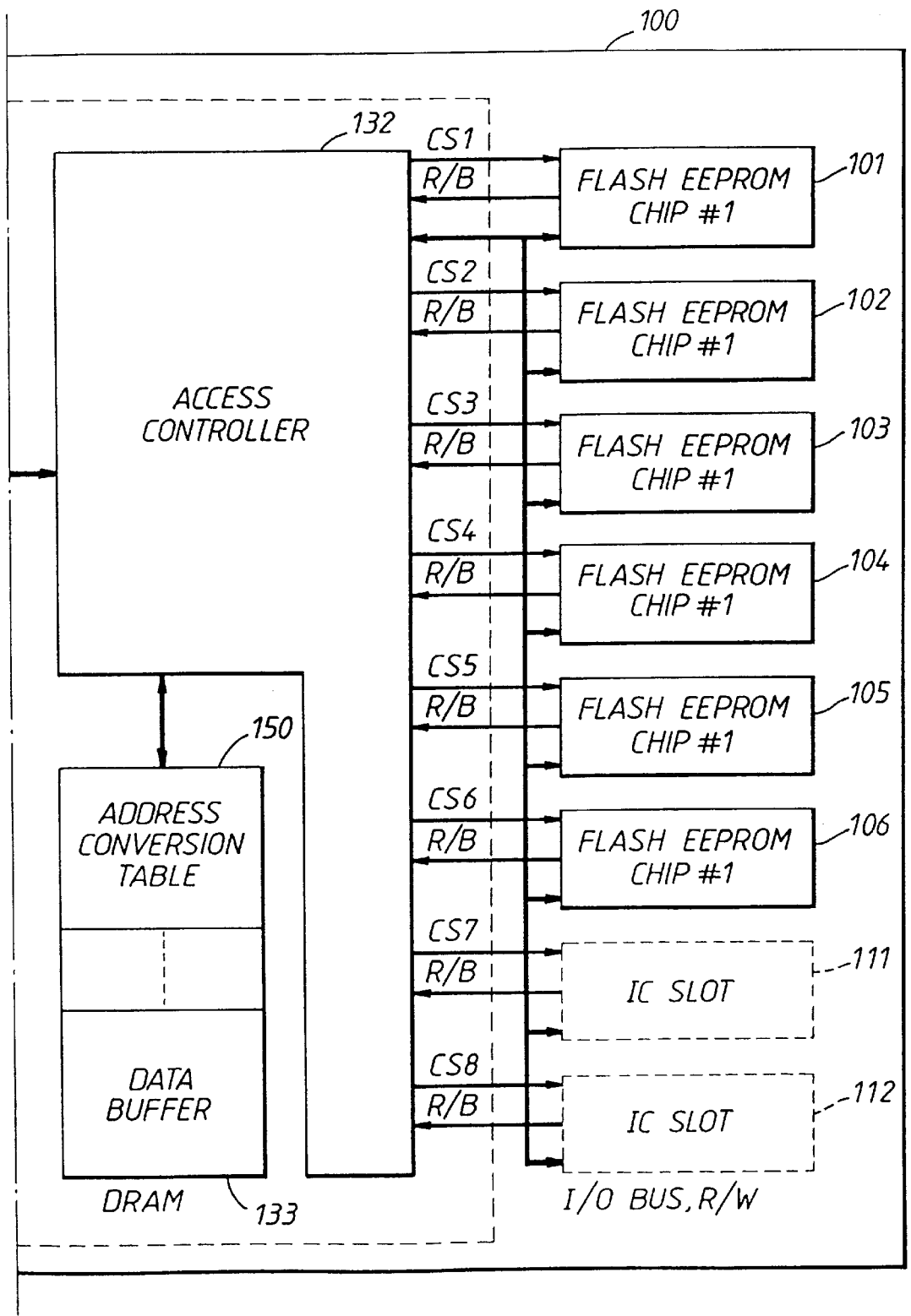
FIG. 2 shows a conceptual diagram of a semiconductor memory system which is controlled as two drives by a host system.
Figures 1C, 2:
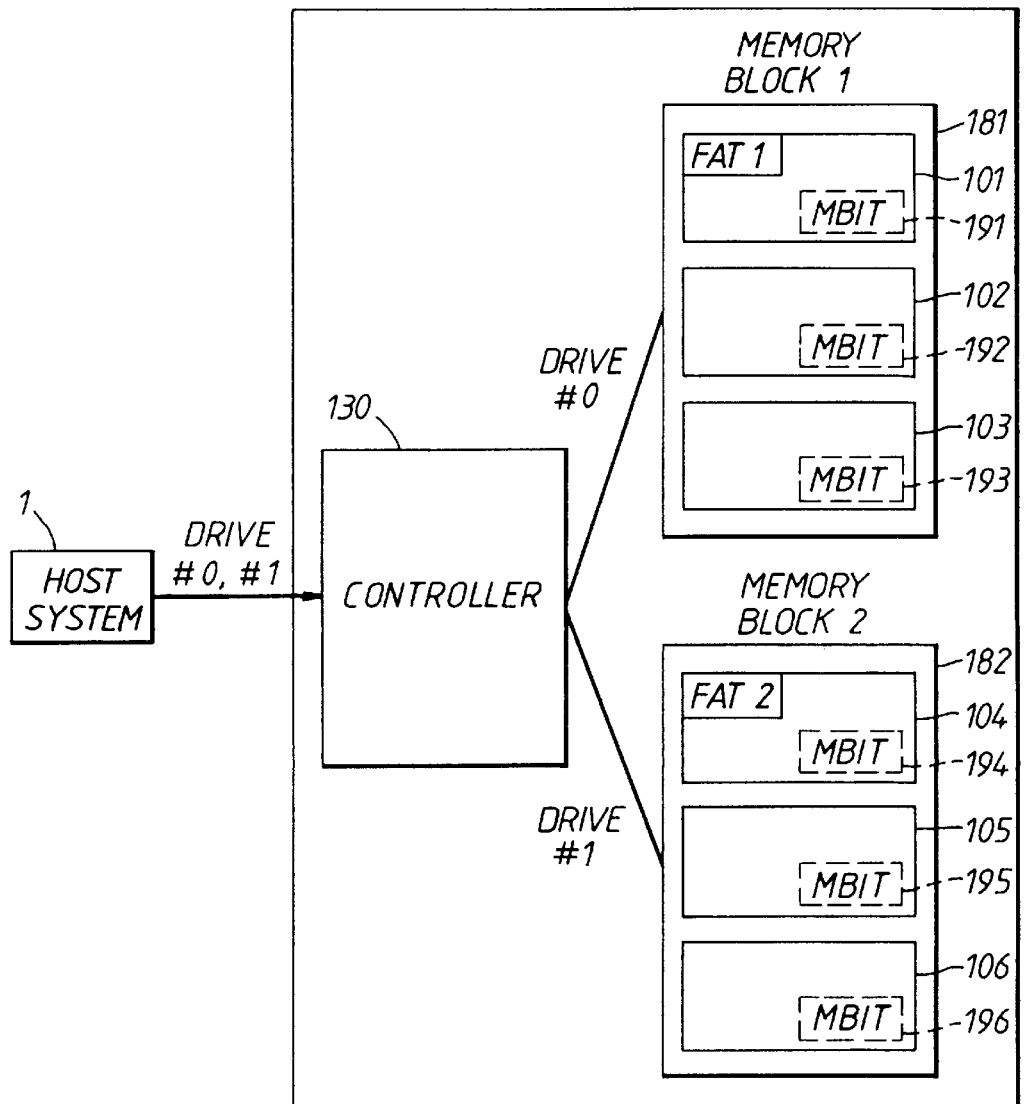
FIG. 1c shows a memory block information table stored in a flash EEPROM chip.

When the host system is powered on, the access controller 132 reads each memory block information table 191–196 (MBIT, as shown in FIG. 1c) which is stored in each flash EEPROM chip 101–106, respectively. The access controller 132 generates an address conversion table 150 according to the memory block information tables and each chip number corresponding to each of the memory block information tables. The generated address conversion table 150 is stored in DRAM 133.

The address conversion table 150 defines address conversion information for indicating a correspondence between logical addresses from the host system 1 and physical addresses of the flash EEPROM chips 101–106. Herein, the logical address, output from the host system, comprises a cylinder number, a head number, a sector number and a drive number. The physical address comprises a chip number of an EEPROM chip and an initial memory address of a sector block in the EEPROM chip.

The address conversion table 150 defines an assigned drive number 0 to the EEPROM chips number 1–3, i.e., chips 101–103 and an assigned drive number 1 to the EEPROM chip number 4–6, i.e., chips 104–106. The host system 1 uses drive number 0 for a master drive, and uses drive number 1 for a slave drive, for example.

The access controller 132 has a microprocessor and firm ware for controlling the processor, and provides access control to the flash EEPROM chips 101–106 for the host interface 120 and the host interface controller 131 in response to a disk access request supplied from the host system 1. That is, the access controller 132 reads commands and parameters stored in the registers in the interface controller 131, and controls the flash EEPROM chips 101–106 in response to the contents of the registers.

The access controller 132 has a function for converting a logical address from the host system 1 into the physical address of the flash EEPROM chips 101–106, according to the address conversion table 150 stored in the DRAM 133.

In the result of the address conversion table 150, the access controller 132 selects one of these flash EEPROM chips (by providing a signal to one of the chip select signal lines CS1–CS6) and generates a real memory address. The access controller 132 repeatedly generates a logical address for a number of times equal to the value in the sector count register and sequentially provides logical addresses to the flash EEPROM chips 101–106, according to the table 150.

The access controller 132 manages the rewrite (or erasing) of each erasable block in each flash EEPROM chip 101–106 for a number of times equal to the rewrite count information in each flash EEPROM chip 101–106. Here, a management unit of rewrite count information is an erasable block of the flash EEPROM chip, for example 4K bytes. The access controller 132 further manages attribute information, such as the number of the connected chips and a total memory capacity of the flash EEPROM chips, by using a configuration table stored in one or more flash EEPROM chips.

The operation of the semiconductor 100 memory system will be described as follows.

The host system 1 provides the command, sector size and the logical address (same HDD address) information to the semiconductor memory system 100 if the semiconductor memory system 100 is not in an active state. The host system 1 judges whether the semiconductor memory system 100 is active or nonactive by the content of the status register 147.

The host interface controller 131 in the semiconductor memory system 100 receives the command, sector size and the logical address information and stores it in the registers 141–146.

The access controller 132 reads the contents of the registers 141–146 in the host interface controller 131 when the host system 1 provides an access request to the semiconductor memory system 100. The access controller 132 determines a physical address from the logical address information in the registers 141, 144, 145, by referring to the address conversion table 150. The access controller 132 further generates a next logical address by incrementing by '1' the value in the register 141, and determining the next physical address from the next logical address by referring to the address conversion table 150. The access controller 132 sequentially decides the physical address by repeating the operation for a number of times equal to the value in the register 142.

The access of a flash EEPROM can be achieved by a command method where an operation mode of the flash EEPROM is specified by a command.

According to the command method, first the access controller 132 provides a chip enable (CE) signal to indicate an active state for the flash EEPROM chip selected by the address conversion table 150. Next, the access controller 132 provides a memory command for indicating an operation mode (write, read, erase, verify and so on) to the flash EEPROM chips 101–106 via a read/write control line. Next, the access controller 132 provides a memory address for indicating an access start address to the flash EEPROM chip 101–106 via the I/O bus. After providing the memory address, if the operation mode is the write mode, then the access controller 132 transfers write data via the I/O bus, and if the operation mode is the read mode, then the access controller 132 receives read data from the selected flash EEPROM via the I/O bus. Here, if the operation mode is the write mode, then the access controller 132 is free from access control for the selected flash EEPROM after transferring write data to the I/O register (for example, 256 bytes) in the selected flash EEPROM, and the write operation is run automatically in the selected flash EEPROM only.

The host system 1 identifies a first memory block (the flash EEPROM chips 101–103) with drive number 0, and identifies a second memory block (the flash EEPROM chips 104–106) with drive number 1. That is, the host system 1 recognizes the semiconductor memory system 100 as having two different secondary memories. The controller unit 130 manages each of the two memory blocks independently. This concept is shown in FIG. 2.

As shown in FIG. 2, the semiconductor memory system 100 is handled as two drives, by a File Allocation Table (FAT) file system installed in the host system 1. A first memory block 181 is managed by a FAT1 stored in the flash EEPROM 101 and a second memory block 182 is managed by a FAT2 stored in the flash EEPROM 104. Accordingly, the semiconductor memory system 100 does not write one file to the first memory block 181 and the second memory block 182 separately. That is, for example, the files of the second memory block 182 are not influenced by changes to or expansion of the first memory block 181.

Accordingly, a user can easily exchange the memory capacity of the first memory block 181 without influencing the files in the second memory block 182. Moreover, each of the first 181 and the second memory block 182 can have total address conversion information for address conversion table 150 without separating address conversion information with respect to association with each of the first 181 or second memory block 182. In this case, address conversion table 150 generated in the access controller 132 can be selected by the host system 1.

Figure 3:
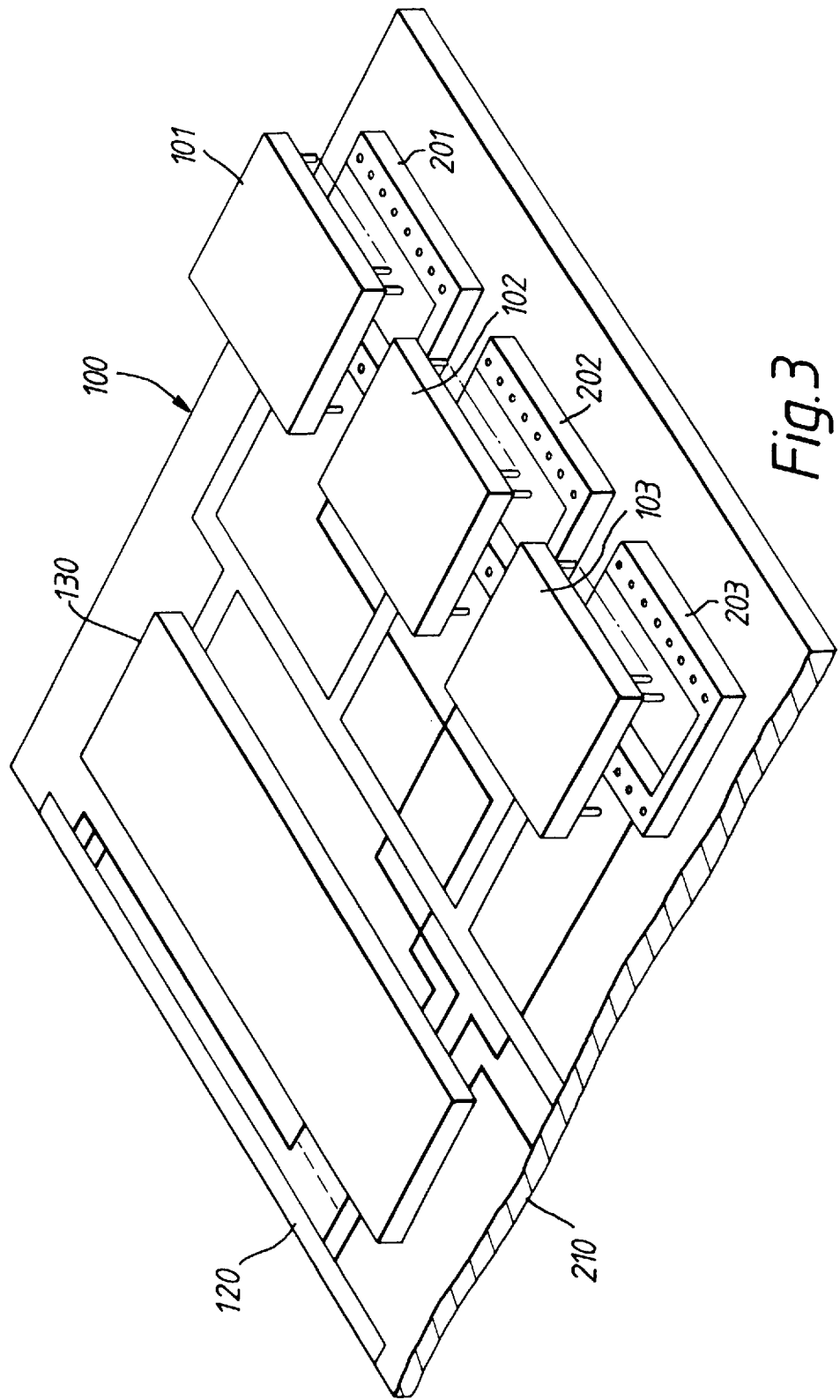
FIG. 3 shows a physical arrangement of a part of the embodiment shown in FIG. 1.

FIG. 3 shows a fascicle arrangement of the semiconductor memory system 100 according to an embodiment of the present invention.

FIG. 3 shows only the flash EEPROMs 101–103 of the first memory block 181, typically.

The controller unit 130 and IC slots 201–203 are directly mounted on a printed circuit board 210, but the flash EEPROM chips 101–103 are mounted on the printed circuit board 210 via IC slots 201–203. As a result, each flash EEPROM chip, including the chips 101–103 can easily be connected and disconnected by user.

Figure 4:
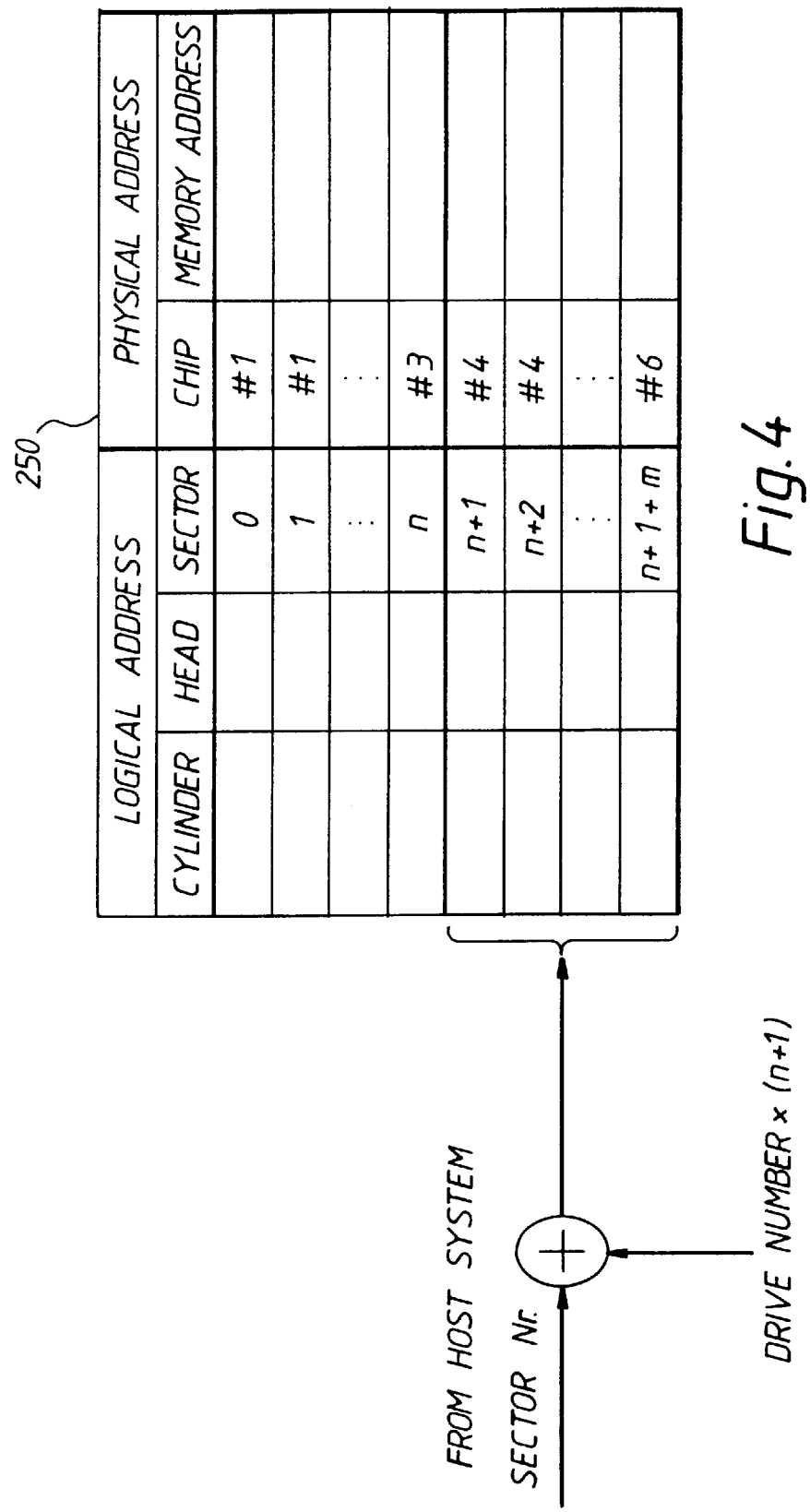
FIG. 4 shows a type of address conversion table used in the embodiment shown in FIG. 1.

FIG. 4 shows another address conversion table 250 which can be used in the access controller 132.

The address conversion table 250 does not list the drive number, but the flash EEPROM chips 101–103 and the flash EEPROM chips 104–106 have continuously assigned sector numbers. In order to manage the sector numbers by each drive, each value of the start sector number assigned to each of the first memory block and the second memory block must begin with 0. However, in this case, each value of the sector numbers of the second memory block 182 listed in the address conversion table 250 adds the value 0-m of real sector numbers to an offset value (n+1). As a result, the access controller 132 operates normally.

Figure 5:
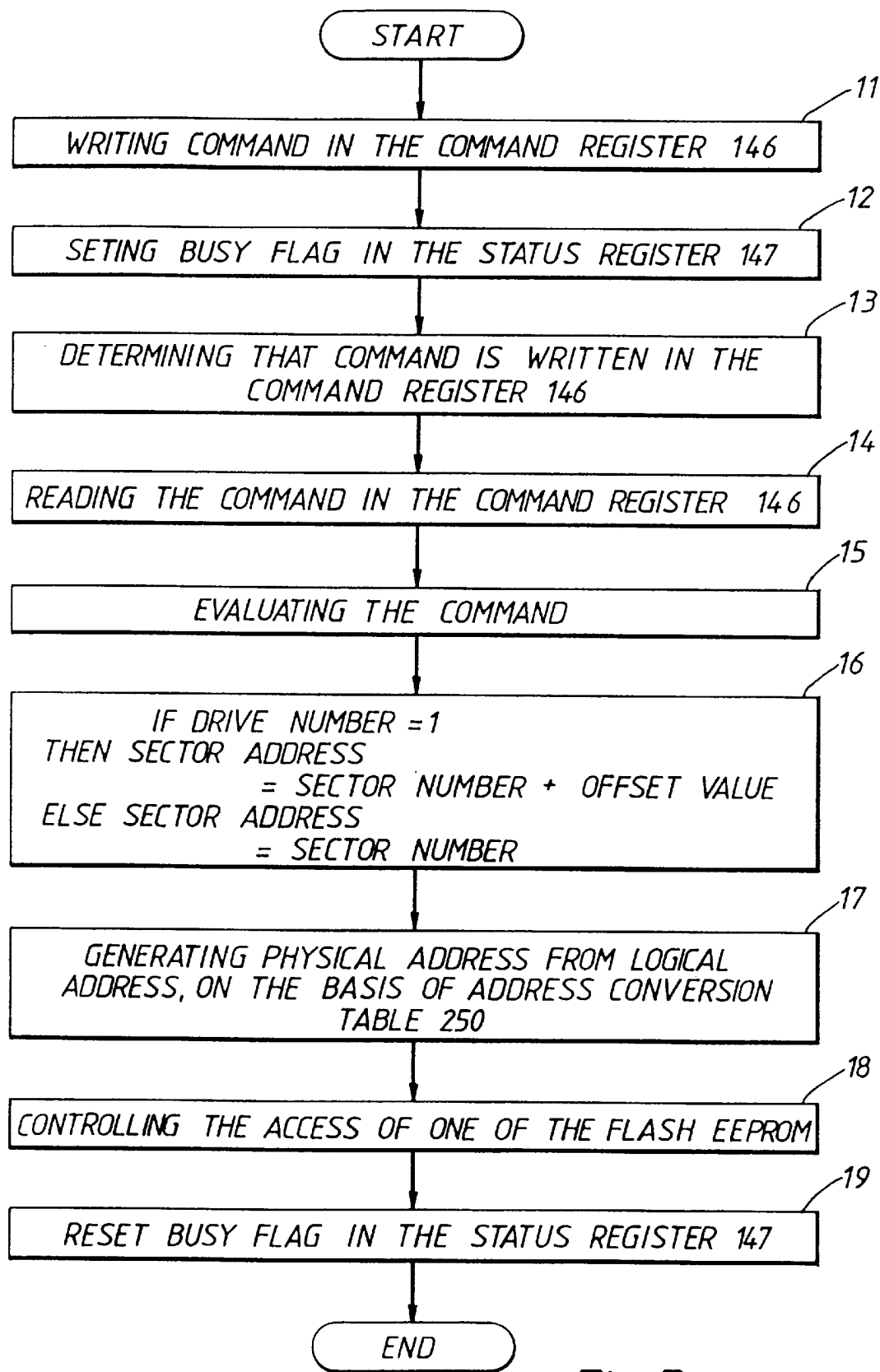
FIG. 5 is a flow chart showing access control processing when the semiconductor memory system uses the address conversion table of FIG. 4.

With reference to the flow chart of FIG. 5, operations of the semiconductor memory system 100 using address conversion table 250 of FIG. 4 will be described.

First, the host system 1 writes a command, such as read or write, in the command register 146 (step 11). Next, the host interface controller 131 sets a busy flag in the status register 147 (step 12). The access controller 132 determines that a command is written in the command register 146, and reads the command in the command register 146 (step 13, 14). The access controller 132 evaluates the command (step 15). The access controller 132 generates a sector address for referring to the address conversion table 250, on the basis of the drive number and the sector number from the host system 1. If the drive number is 1, then the sector address is the sector number plus offset value (n+1), otherwise the sector address is the sector number (step 16). The access controller 132 generates a physical address from logical address (having the sector address) on the basis of the address conversion table 250 (step 17). Next, the access controller 132 controls the access of one of the flash EEPROM chips 101–106 according to a physical address generated by the address conversion table 250 and the command (step 18). Last, the host interface controller 131 resets the busy flag in the status register 147 (step 19).

In this embodiment, the host system 1 can recognize the first 181 and the second memory blocks 182 as independent disk drives. The FAT file system in the host system 1 can independently manage data written in the first memory block 181 and data written in the second memory block 182.

For example, even though a user replaces at least one of the EEPROM chips 104–106 of the second memory block 182 with another EEPROM chip, the files stored in the first memory block are not influenced because the semiconductor memory system does not write separately the first memory block and the second memory blocks.

Accordingly, each memory block 181, 182 managed by each drive can easily change the capacity of the memory block, such as structuring the first memory block 181 to consist of the two EEPROM chips 101, 102 only, without influencing the other memory block.

Moreover, each memory block 181, 182 managed by each drive can easily be able to replace at least one of the EEPROM chips in either memory block with another EEPROM chip without influencing the other memory block.

Next is described a memory management operation when a new flash EEPROM chip is connected to an IC slot 111.

Figure 6:
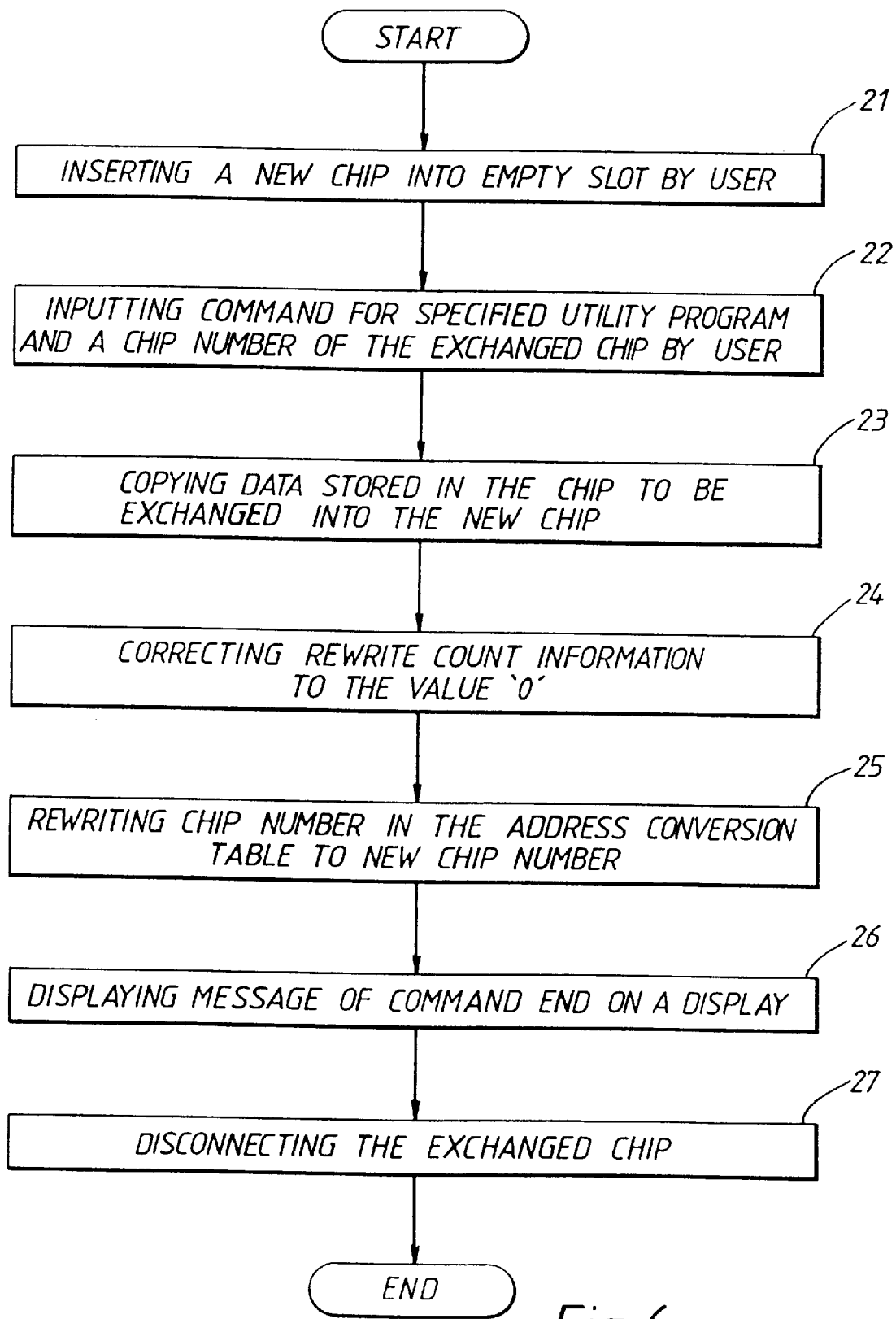
FIG. 6 is a flow chart showing a process of exchanging a flash EEPROM chip for another flash EEPROM chip of the same memory capacity.

FIG. 6 shows a process flow chart for exchanging a flash EEPROM chip, such as a flash EEPROM chip having an erasable block which has been rewritten more than a desired number of times, with a new flash EEPROM chip of the same size which is connected to the empty slot.

The access controller 132 monitors and controls the number of times each erasable block in each flash EEPROM chip 101–106 is rewritten (or erased) by using rewrite count information in each flash EEPROM chip 101–106. When one of the flash EEPROM chips 101–106 has an erasable block which has been rewritten more than a desired number of times, the access controller 132 provides a chip number corresponding to the particular EEPROM chip to the host system 1.

The host system 1 displays a message indicating the chip number of the chip which must be exchanged. The user connects a new flash EEPROM chip of the same size into an empty slot, such as the IC slot 111 (step 21). Next, the user inputs a command for running a utility program for enabling the use of the new flash EEPROM chip, and inputs the chip number of the exchanged chip (step 22). Here, the host system 1 provides a command for running the utility program and the chip number to the access controller 132, and the utility program is run by the MPU in the access controller 132. The access controller 132 directly copies all information stored in the chip to be exchanged (for example, flash EEPROM 101), into the new chip connected to the slot 111 (step 23). The number of the IC slot to which the new flash EEPROM chip is connected can be determined by referring to each Ready/Busy signal. For example, when the new flash EEPROM chip is connected to the IC slot 111, the Ready/Busy signal, indicating a state of high impedance level or ground level, changes to Ready state because of insertion of the new flash EEPROM chip. Thus, the access controller 132 can determine the number of the slot to which the new flash EEPROM is connected by change of the Ready/Busy signal. Next, the MPU initializes the rewrite count information in the new flash EEPROM to a value '0', because the controller has copied the rewrite count information of the exchanged flash EEPROM chip into the new flash EEPROM chip in the previous copy operation (step 24). Next, the MPU writes the address conversion table 150, to correct the chip number of the registered physical address to the chip number of the new flash EEPROM chip (step 25). For example, when the number of the new chip connected to the slot 111 is 7, the address conversion table 150 of FIG. 1 is connected to change the registered chip number '1' into the chip number '7'. In response to the MPU signaling an end of the exchanging operation to the host system, the host system 1 displays a message indicating an end of the exchanging operation (step 26). The user removes the exchanged flash EEPROM chip, after receiving the message from the host system (step S27).

The host system 1 can handle the new EEPROM chip as the drive 0 in the semiconductor memory system 100. Also, the memory capacity of the new flash EEPROM chip can be different from the memory capacity of the exchanged flash EEPROM chip.

Figure 7:
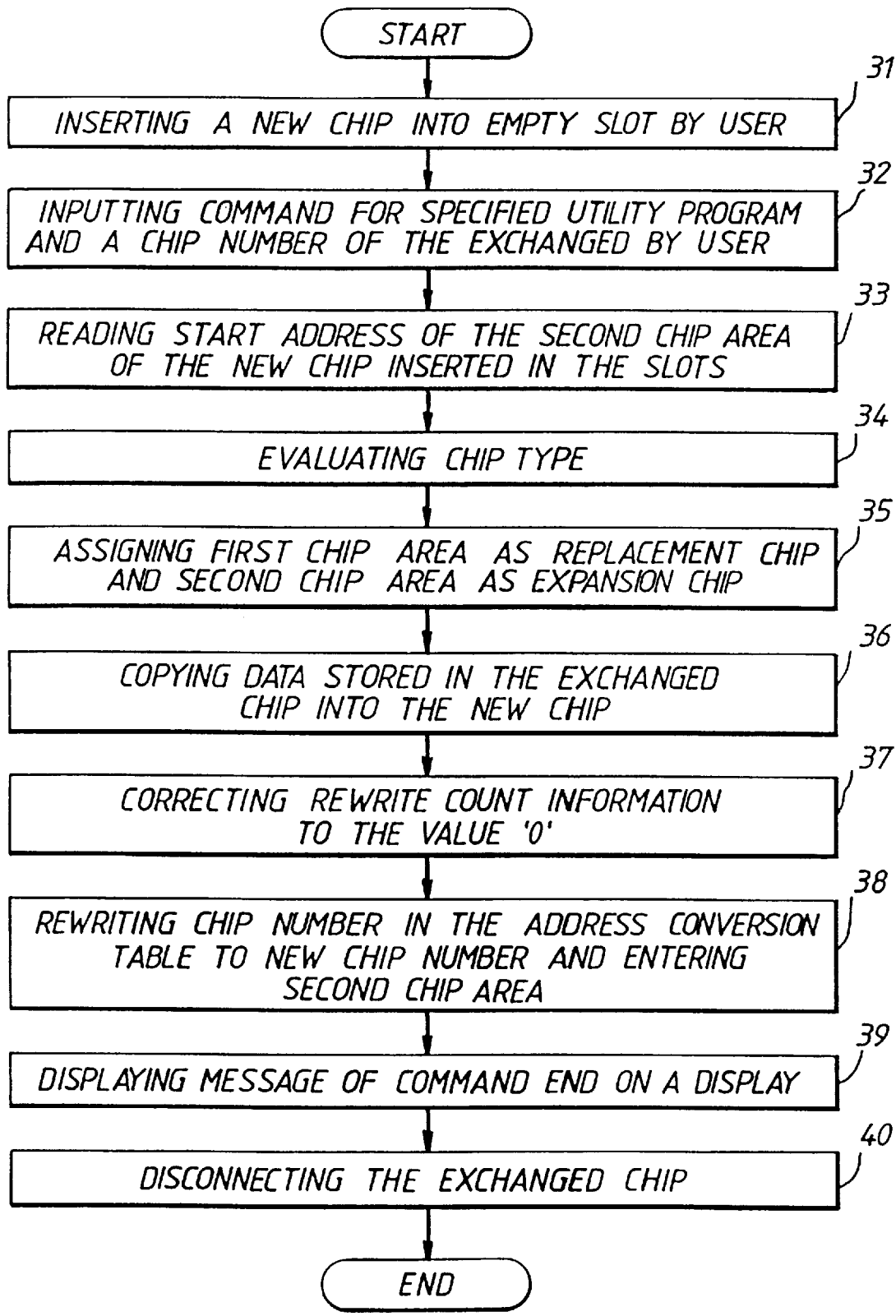
FIG. 7 is a flow chart showing a process of exchanging a flash EEPROM chip for another flash EEPROM chip of double memory capacity.

FIG. 7 shows a process flow chart for exchanging a flash EEPROM chip (chip type 1), such as a flash EEPROM chip having an erasable block which has been rewritten more than a desirable number of times, for a new flash EEPROM chip of double memory capacity (chip type 2) connected to an empty slot.

The user connects a new flash EEPROM of the chip type 2 to the empty slot, such as the slot 111 (step 31). Next, the user inputs a command for running a utility program for enabling the use of the new flash EEPROM chip, and inputs the chip number of the exchanged chip (step 32). Here, the host system 1 provides a command for running the utility program and the chip number to the access controller 132, and the utility program is run by the MPU in the access controller 132.

The access controller 14 recognizes a chip type of the new flash EEPROM chip inserted into the slot 111. A method for recognizing the chip type can be achieved by determining whether or not the access controller 132 reads an ID stored at a head address (BOBO) of a second chip area of the flash EEPROM. The second chip area is an area in excess of the memory size of the chip being replaced. For example, when an exchanged chip has 4 M byte of memory and a new chip has 8 M byte of memory, a second chip area is the area of the new chip in excess of 4 M byte. If the new flash EEPROM chip does not have a second chip area, then the address BOBO does not exist. Thus, the access controller 132 determines the chip type (step 33,34). In this case, if the access controller 132 can read the ID, then the access controller 132 determines the new chip is type 2, otherwise the new chip is type 1. In the case of determining that the chip is type 2, the MPU determines a first chip area of the new flash EEPROM chip as an area for exchanging the exchanged chip, and determines the second chip area as an area for expanding memory area (step S35). The access controller 132 copies all information stored in the chip to be exchanged (for example, flash EEPROM chip 101), into the first chip area of the new flash EEPROM chip connected to the slot 111 (step S36). The MPU initializes the rewrite count information in the new flash EEPROM to a value '0' because the controller copied the rewrite count information of the exchanged flash EEPROM chip into the new flash EEPROM chip in the previous copy operation (step 37). Next, the MPU writes the address conversion table 150, to correct the chip number registered physical address to the chip number of the new flash EEPROM chip. Moreover, the MPU enters the second chip area in the address conversion table (step 38). For example, when the number of the new chip connected to the slot 111 is 7, the address conversion table 150 of the FIG. 1 is corrected to change the registered chip number '1' to the chip number '7'. Further, the address conversion table 150 next lists the second chip area as a new logical area. Now, the chip number of the second chip area is #7, but the head address of the second chip area is the next address after the last address of the first chip area. Next, in response to the MPU signaling an end of the exchanging operation to the host system, the host system 1 displays a message indicating the end of the exchanging operation (step 39). The user removes the exchanged flash EEPROM chip after receiving the message from the host system (step 40).

Figure 8:
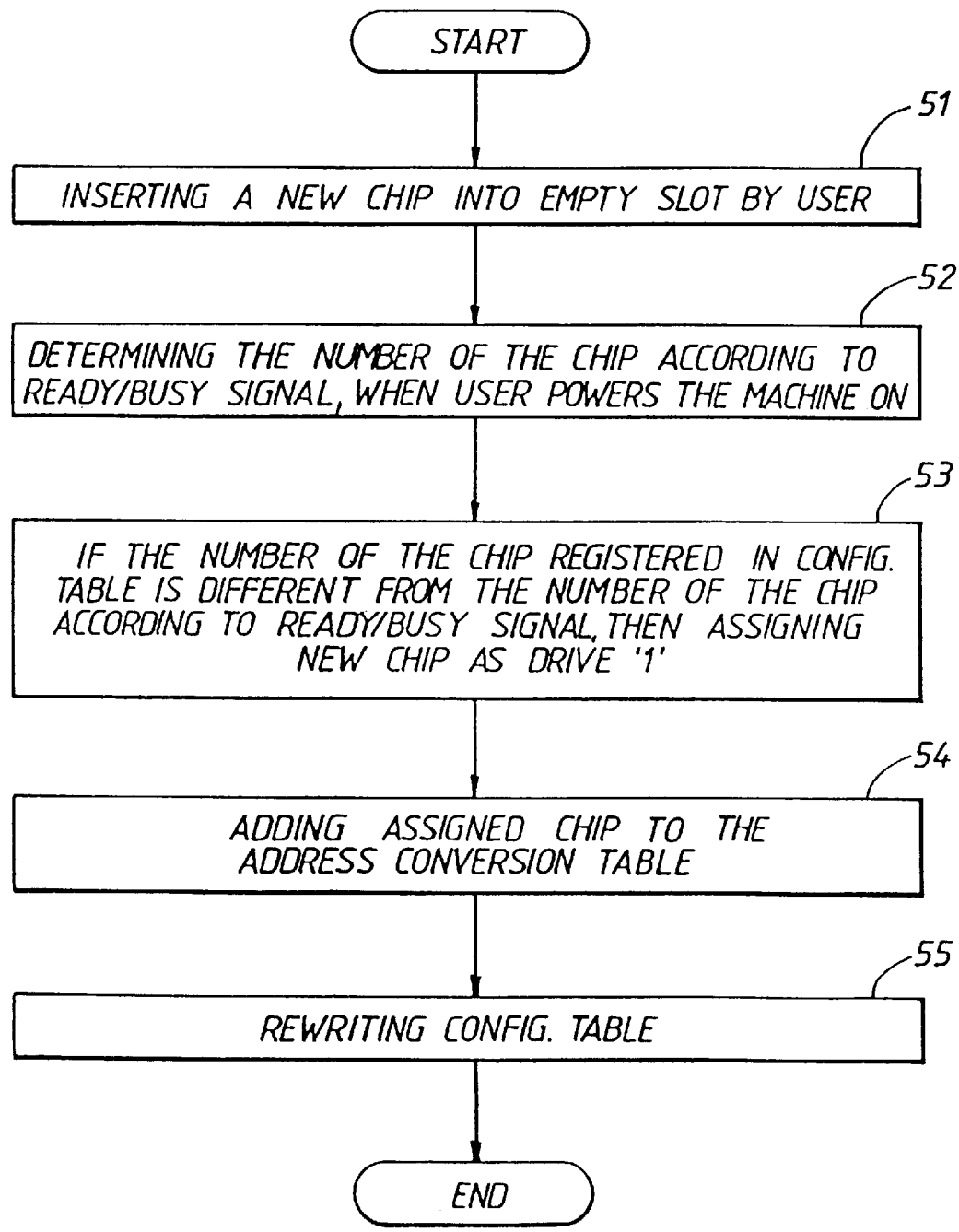
FIG. 8 is a flow chart showing a process of expanding a flash EEPROM chip without exchanging flash EEPROM chips.

FIG. 8 shows a flow chart for expanding flash EEPROM chip memory without exchanging flash EEPROM chips. Hereinafter, the semiconductor memory system has only flash EEPROMs 101–103 as drive #0, and will handle a new expanded flash EEPROM chip or chips as drive #1.

The user inserts a new flash EEPROM chip in to an empty slot, for example the slot 111 (step 51). Next, as a result of the host system being turned on by the user, the MPU in the access controller 132 knows the number of the chips in the semiconductor memory system (step 52). The number of chips can be determined by referring to each Ready/Busy signal line. Next, when the MPU determines it is necessary to expand the memory by comparing the number of chips determined to be connected by the Ready/Busy signals, with the number of chips registered in the config. table, the MPU assigns the expanded chip as drive #1 (step 53). The MPU enters logical addresses assigned as drive #1 in the address conversion table 141 (step 54). After this, the MPU rewrite the number of the chips stored in the config. table to include the new value of the expanded flash EEPROM chip (step 55). As a result, the host system 1 handles the semiconductor memory system 100 as two disk devices corresponding to the drives #0 and 1.

Further, the semiconductor memory system 100 can not only add to the number of drives, but also can expand memory capacity of the drive 0 or drive 1 by expanding the flash EEPROM chip. For example, in the case of increasing memory capacity of drive #1, the access controller 132 will assign the new logical address following the last logical address in the drive #1 to the new chip.

Accordingly, the semiconductor memory system can exchange memory area of one independent drive, according to replacing and expanding (or reducing) EEPROM chips.

Figure 9:
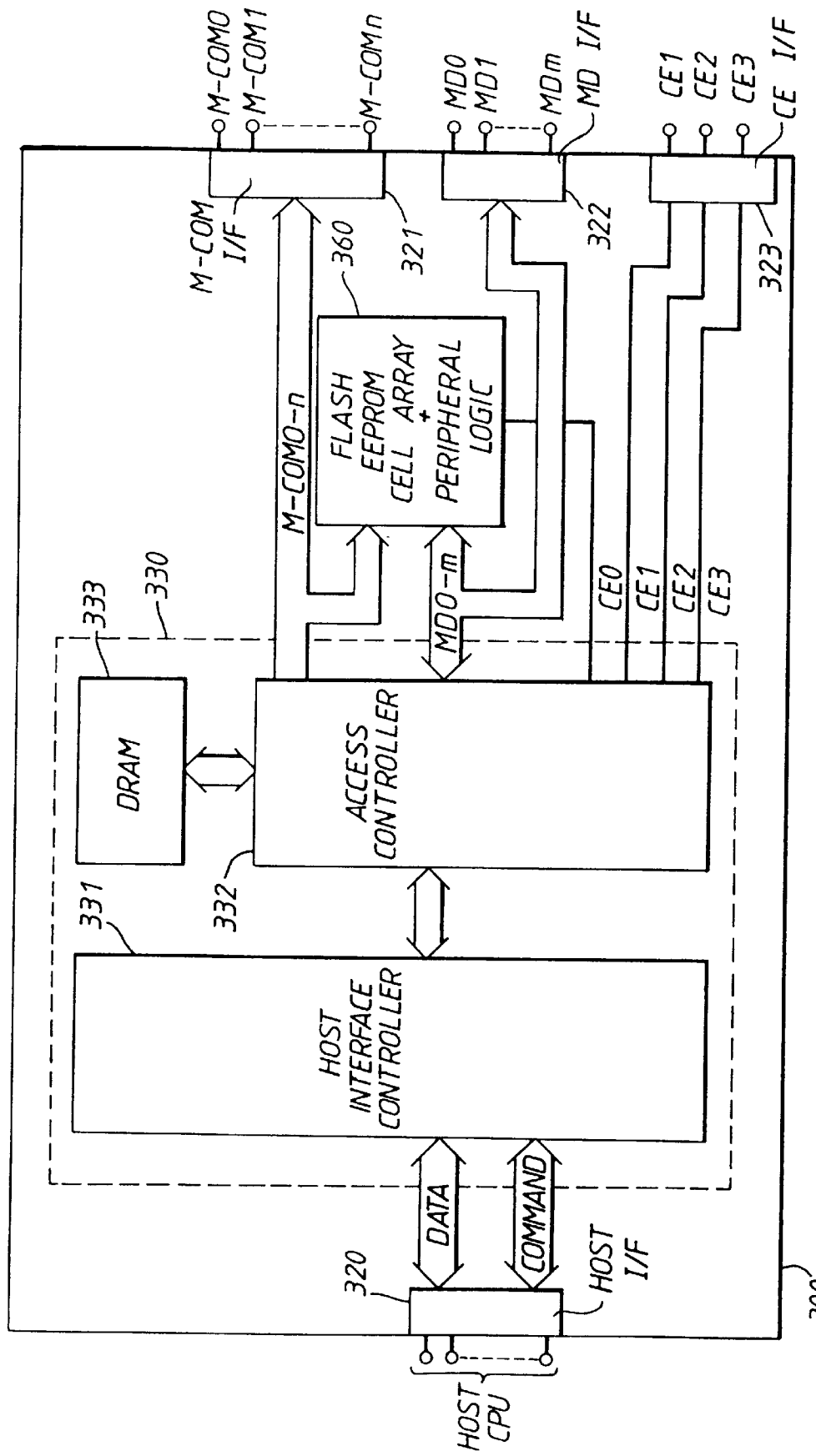
FIG. 9 is a block diagram of a single package LSI showing another embodiment of the present invention.

FIG. 9 shows yet another embodiment of the present invention.

The semiconductor disk LSI 300 is structured as a single package. The semiconductor disk LSI 300 comprises a flash EEPROM unit 360, a controller unit 330, a host interface 320, a memory command interface 321, memory data interface 322, and chip enable (CE) interface 323.

The flash EEPROM unit 360 comprises an EEPROM cell array and a plurality of peripheral logics, such as a row address decoder for the cell array. The flash EEPROM unit 360 has an input/output (I/O) register, for example structured 256 byte. In the flash EEPROM unit 360, a minimum unit amount of data handled in a write or an erase operation is determined and the unit amount of data is handled together. For example, it is assumed that the flash EEPROM unit 360 allows data write operations in pages of 256 bytes and data erase operations in blocks of 4K bytes.

The controller unit 330 comprises a host interface controller 331, an access controller 332 and a DRAM 333.

The host interface controller 331 and the DRAM 333 have functions the same as the host interface controller 131 and the DRAM 133 as shown in FIG. 1.

The host interface 320, like a hard disk drive connectable to the host system 1 has, for example, a 40-pin arrangement conforming with the IDE interface, or like an IC card installable in an IC card slot, has, for example, a 68-pin arrangement conforming with the PCMCIA interface.

The memory command interface 321, the memory data interface 322 and the chip enable interface 323 provide access control of expansion flash EEPROM chips, and each interface 321–323 has a plurality of input/output pins for receiving and transferring each signal between each interface 321–323 and expansion flash EEPROM chips 401–403.

The access controller 332 provides access control of the flash EEPROM unit 360 via the host interface 320 and the host interface controller 331, in response to a disk access request supplied from a host system 1.

There is described a method by which the access controller 332 controls access to the flash EEPROM unit 360.

First, the access controller 332 provides a chip enable (CE) signal 0 to indicate an active state to the flash EEPROM unit 360. Next, the access controller 332 provides a command for indicating an operation mode (write, read, erase, verify and so on) to the flash EEPROM unit 360 via the read/write control line. Next, the access controller 332 provides a memory address for indicating an access start address to the flash EEPROM unit 360 via the I/O bus. After providing the memory address, if the operation mode is the write mode, then the access controller 332 transfers write data via the I/O bus, and if the operation mode is the read mode, then the access controller 332 receives read data from the flash EEPROM unit via the I/O bus. Here, if the operation mode is the write mode, the access controller 332 releases access control for flash EEPROM unit 360 after transferring write data to the I/O register in the flash EEPROM unit 360, and the write operation is run automatically by the flash EEPROM unit 360 itself.

The access controller 332 can not only control the flash EEPROM unit 360 in the semiconductor LSI 300, but can also provide the same access control to a plurality of expansion flash EEPROM 401–403 chips connected to the semiconductor LSI 300, as needed.

Figure 10:
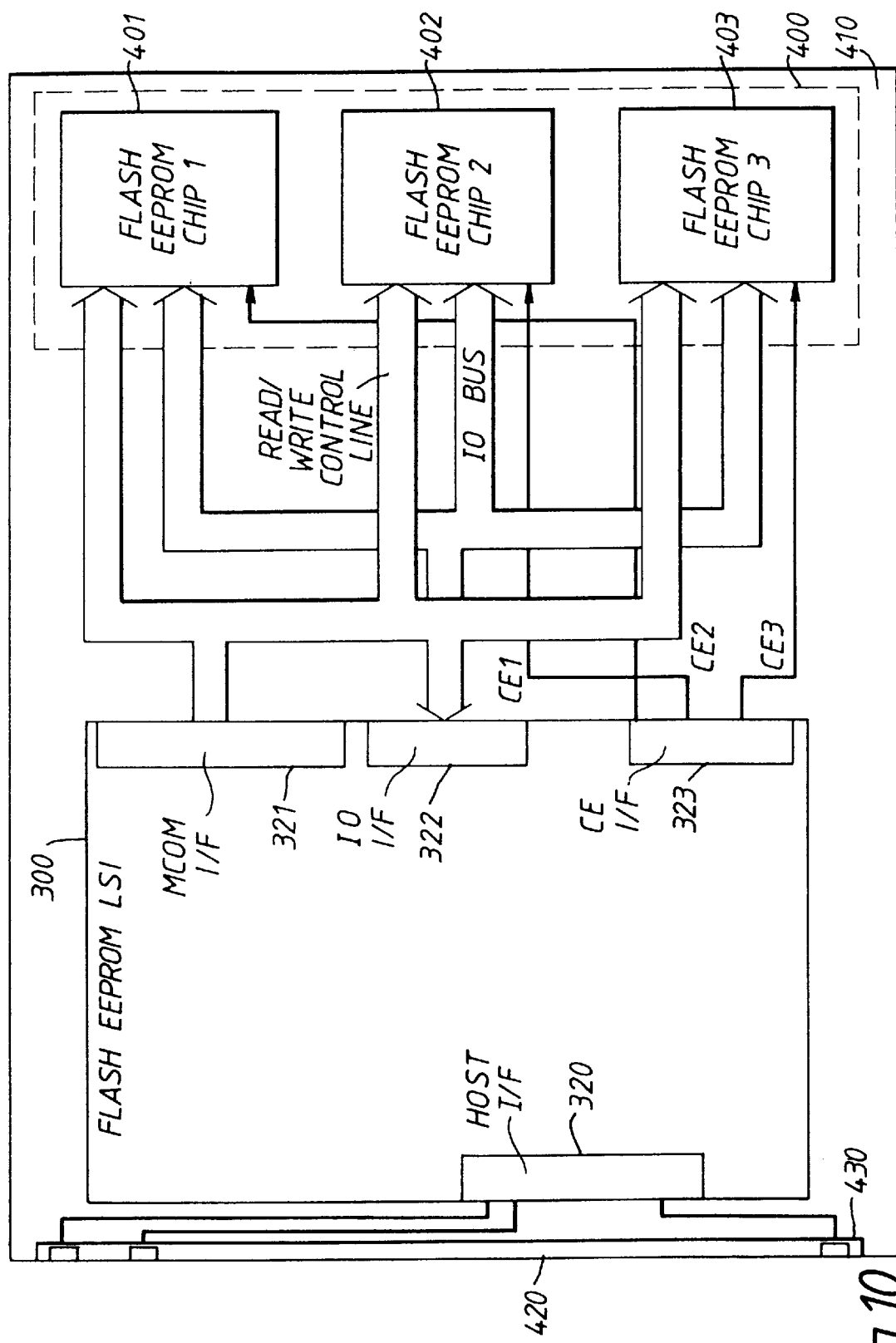
FIG. 10 is a block diagram of the semiconductor memory system using the single package LSI shown in FIG. 9.

Referring to FIG. 10, a semiconductor memory system structured by a unit which includes the semiconductor disk LSI 300, such as a memory board and a memory card will be described.

A semiconductor memory system unit 420 is structured by a printed circuit board 410 on which the semiconductor disk LSI 300 and three flash EEPROM chips 401–403 are mounted. Each flash EEPROM chip 400–403 is connected to the memory command interface 321 via a common read/write control line, and is connected to the memory data interface 322 via a common I/O bus. Each flash EEPROM chip 401–403 is independently connected to the chip enable interface 323 via a chip enable signal line and a Ready/Busy signal line (not shown), and receives the chip enable signal from the chip enable interface 323. Moreover, the semiconductor memory system unit 420 has a card edge type connector 430 for connecting between the host system 1 and the host interface 320 in the semiconductor disk LSI 300.

In response to generating one of the chip enable signals CE 1–3, one of the expansion flash EEPROM chips 401–403 is selected. Hereinafter, CE 1, CE 2 and CE 3 are used for selecting each expansion flash EEPROM chip. In the case of selecting the expansion flash EEPROM chip 401, CE 1 is generated. Similarly, in the case of selecting the expansion flash EEPROM chip 402, CE 2 is generated. Similarly, in the case of selecting the expansion flash EEPROM chip 403, CE 3 is generated.

The chip enable signal is generated by the access controller 332, on the basis of an address conversion table 350, as shown in FIG. 11.

The address conversion table 350 defines the relation between logical addresses and physical address. The logical addresses have a track (cylinder+head) number and a sector number. The physical address has a chip number and a memory address. The chip number is used for determining the chip enable signal.

If the access controller 332 receives a logical address between track number 0 and L, then the address conversion table 350 indicates that chip enable signal 0 (CE 0) should be generated for selecting internal flash EEPROM unit 360. Similarly, if access controller 332 receives a logical address between track number L+1 and 2L, the address conversion table 350 indicates that chip enable signal 1 (CE 1) should be generated for selecting the first expansion flash EEPROM chip 401. Similarly, if access controller 332 receives a logical address between track number 2L+1 and 3L, the address conversion table 350 indicates that chip enable signal 2 (CE 2) should be generated for selecting the second expansion flash EEPROM chip 402. Similarly, if access controller 332 receives a logical address between track number 3L+1 and 4L, the address conversion table 350 indicates that chip enable signal 3 (CE 3) should be generated for selecting the third expansion flash EEPROM chip 403.

Thus, the semiconductor disk LSI 300 can be structured as a single chip which can control the internal flash EEPROM and the expansion EEPROM chips.

Therefore, a semiconductor memory system 420 including the semiconductor disk LSI 300 is able to reduce the number of parts and to achieve miniaturization and low-cost.

Figure 12:
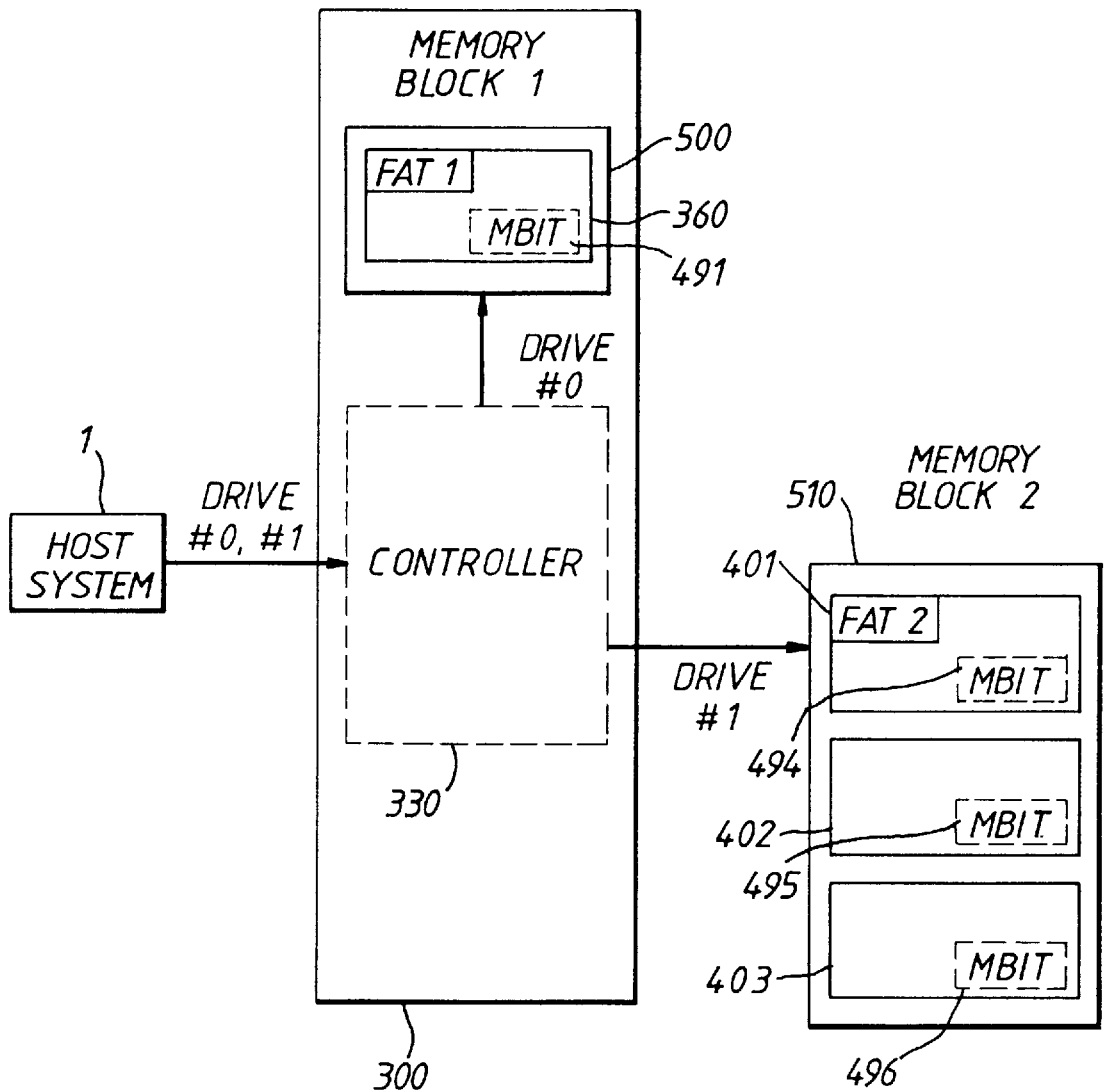
FIG. 12 shows a conceptual diagram of a semiconductor memory system which is controlled as two drives by a host system and which uses the single package LSI shown in FIG. 9.

When the semiconductor memory system 420 is used by the host system 1, the host system 1 is further able to assign the semiconductor memory system unit 420 to two disk drives, as in the above embodiment. This concept is shown by FIG. 12.

The host system 1 assigns a first memory block 500 (the flash EEPROM unit 360) the drive number 0, and assigns a second memory block (the expansion flash EEPROM 401–403) the drive number 1. That is, the host system 1 recognizes the semiconductor memory system 420 as two different secondary memories. The semiconductor disk drive LSI 300 manages each memory block independently, according to each MBITs (memory block information table) 491, 494, 495, 496. Moreover, the flash EEPROM chips 401–403 can be connected to the printed circuit board via a slot, in the same manner as IC slots 201–203 as shown in FIG. 3.

Thus, a user can expand memory capacity in the semiconductor memory system unit easily, according to need.

The following describes an embodiment of a semiconductor memory system which uses the semiconductor disk LSI 300 as shown FIG. 9 through FIG. 12 as secondary memory in a personal computer.

Figure 13:
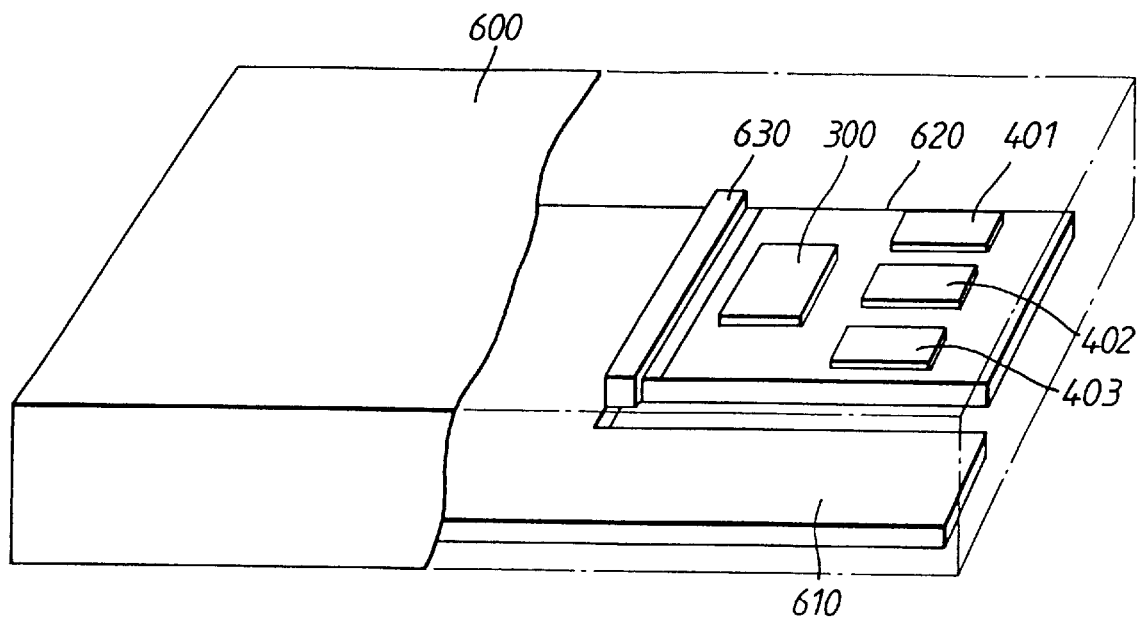
FIG. 13 shows a physical arrangement of a host system including a semiconductor memory system structured on a memory board.

FIG. 13 and FIG. 14 show a host system 600 connected to a semiconductor memory system, which is a memory board type.

A CPU 611, main memory 612, two I/O controllers 613, 614, a connector 630, etc., mount on a mother board 610 in the host system 600, and each component is interconnected to a system bus 615. The semiconductor memory system is structured to include a memory board 620 on which is mounted the semiconductor disk LSI 300 and three flash EEPROM chips 401–403. The memory board 620 is connected to the host system 600 via the connector 630. The memory board 620 is also connected to the system bus 615. Moreover, the memory board 620 becomes a memory card, if the memory board 620 is provided as a package.

The following describes another embodiment of a semiconductor memory system which uses the semiconductor disk LSI 300 as secondary memory in a personal computer.

Figure 15:
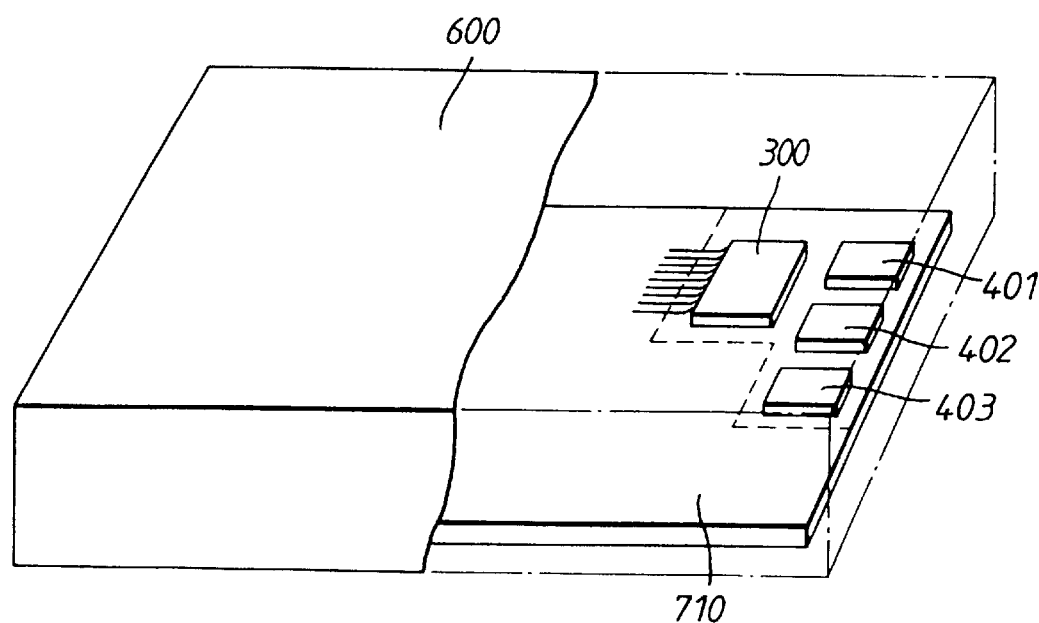
FIG. 15 shows a physical arrangement of a host system including chips of the semiconductor memory system mounted on a mother board of the host system.
Figure 16:
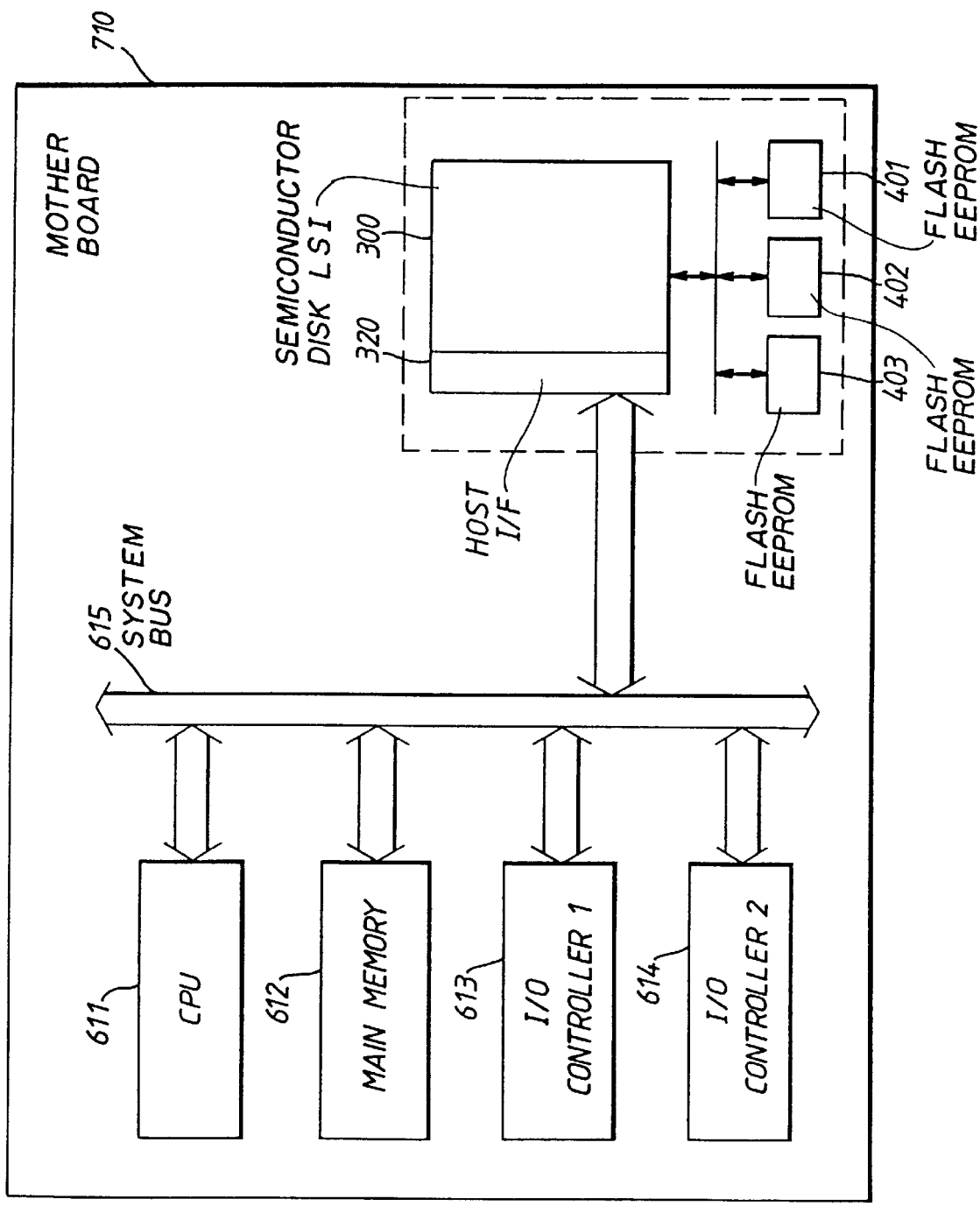
FIG. 16 is a block diagram of the host and semiconductor memory systems shown in FIG. 15.

FIG. 15 and FIG. 16 show a semiconductor memory system, which is structured to include the semiconductor disk LSI 300 and three flash EEPROM chips 401–403 mounted on a mother board 710 in the host system 600.

A CPU 611, main memory 612, two I/O controllers 613, 614, etc., are mounted on the mother board 710 in the host system 600, and each component is interconnected to the system bus 615. Each of the semiconductor disk LSI 300 and three flash EEPROM chips 401–403 used for structuring the semiconductor memory system can be handled as a peripheral chip, such as the CPU chip 611, and can be connected to the system bus 615 directly.

The mother board 710 in the host system 600 does not require a connector for a memory card or a memory board. Therefore, a mounting layout on the mother board 710 is more flexible.

Figure 17:
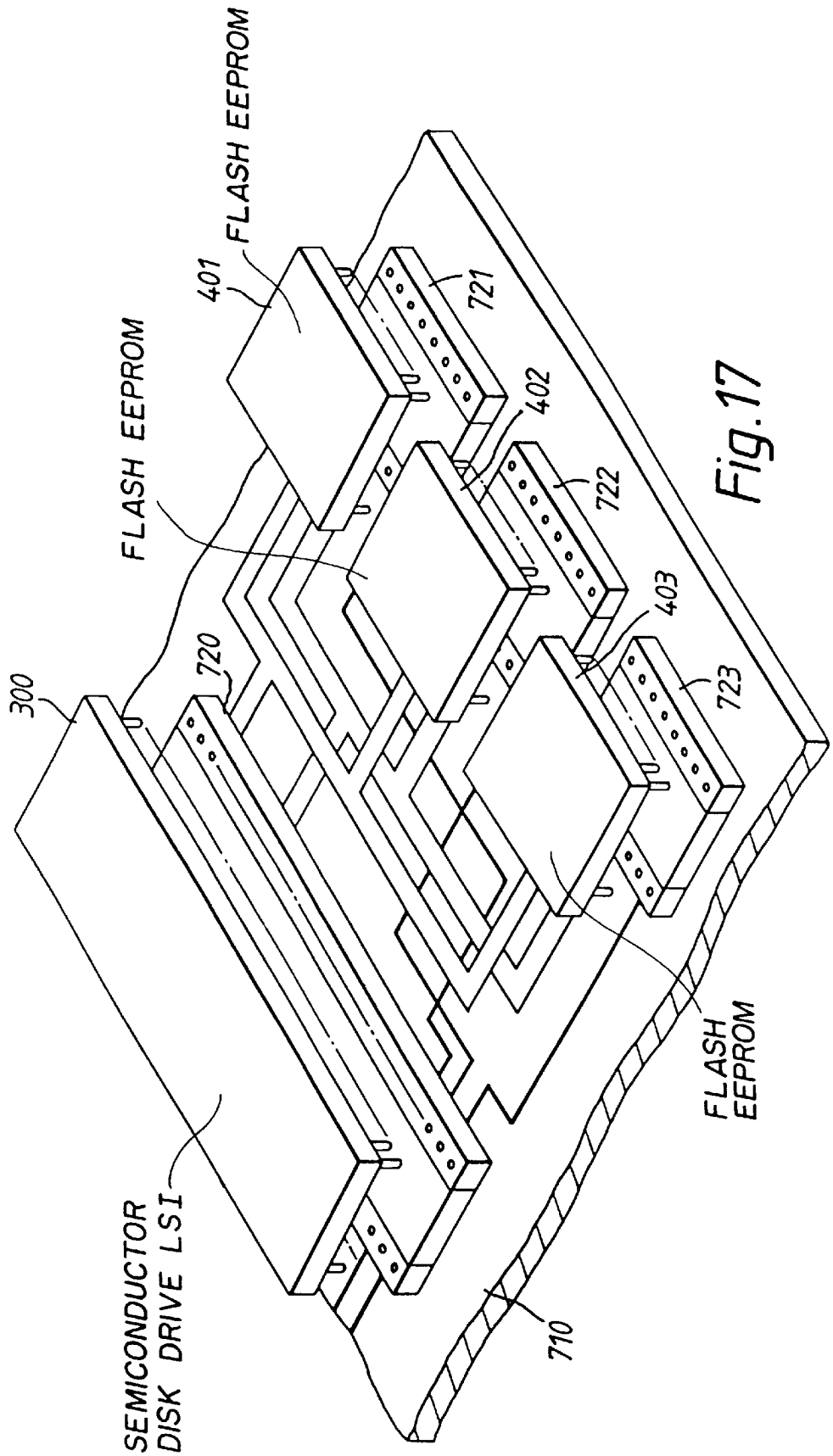
FIG. 17 shows a physical arrangement of a host system including connectors for inserting the single package LSI chip and a plurality of flash EEPROM chips of the semiconductor memory system on a mother board in the host system.

FIG. 17 illustrates a physical arrangement of the mother board 710.

A LSI slot 720 and IC slots 721–723 are directly mounted on the mother board 710, but the semiconductor disk drive LSI 300 is mounted on the mother board 710 via the LSI slot 720 and the flash EEPROM chips 401–403 are mounted on the mother board 710 via the IC slots 721–723.

Therefore, the mother board adds only four slots 720–723 and lines for interconnecting to each slot, because the semiconductor disk drive LSI 300 and each flash EEPROM chip 401–403 can easily be connected and disconnected by the user. Therefore, the user can freely select whether the semiconductor memory system is introduced in the personal computer 600.

Figure 18:
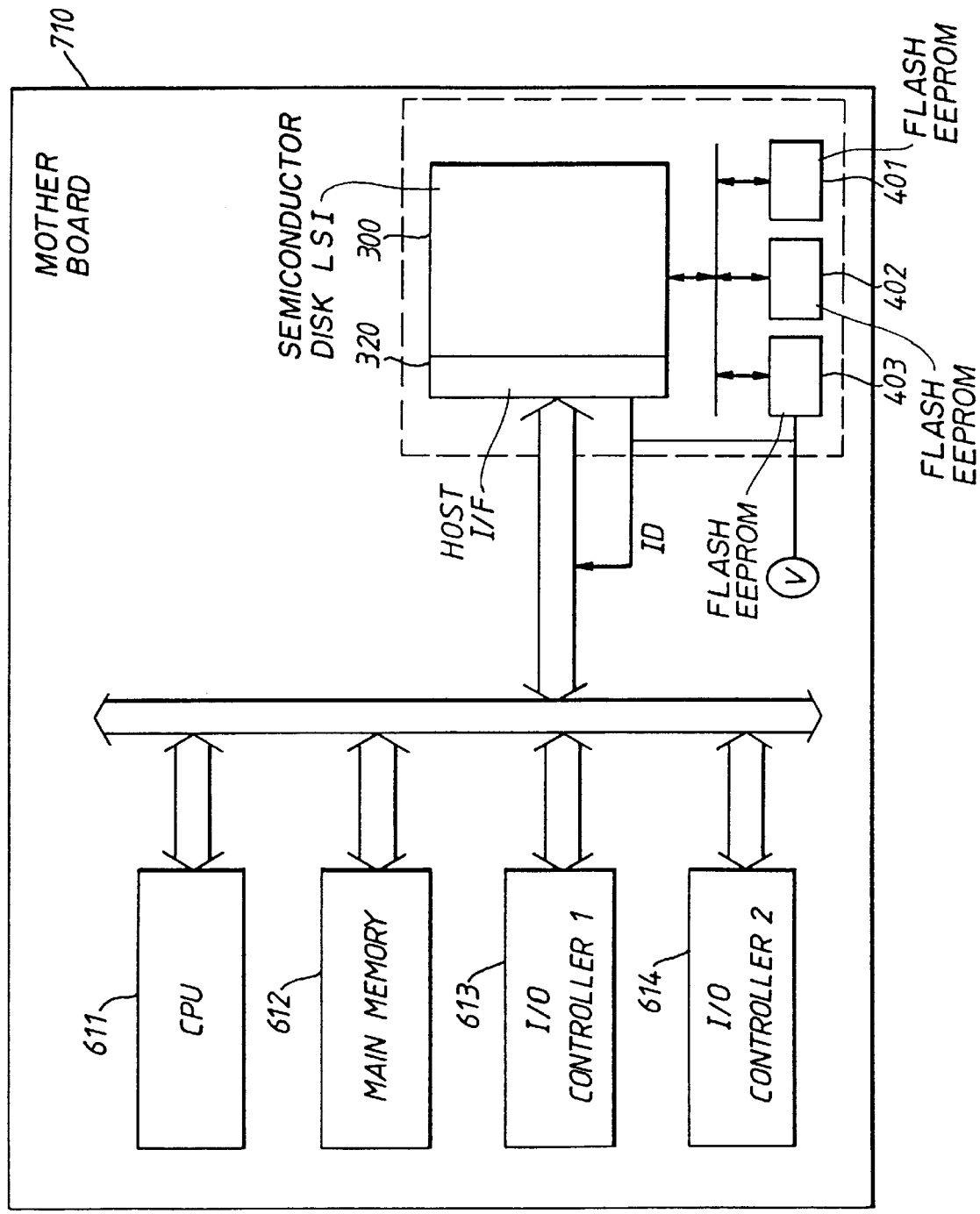
FIG. 18 is a block diagram of the host system having lines for determining whether or not the single package LSI chip shown in FIG. 17 is inserted into its connector.

Further, with reference to FIG. 18, the host interface 320 in a semiconductor disk LSI 300 may have a signal ID in the case of mounting the semiconductor disk drive LSI 300 on the mother board 710. The signal ID indicates whether the semiconductor disk drive LSI 300 is connected to the LSI slot 720. The signal ID is provided as a high active state by an electrical charge terminal for keeping the high active state. Generally speaking, a magnetic disk interface used by a host system uses the ID signal for determining whether the magnetic disk drive is connected to the host system. Thus, the magnetic disk interface can be used without exchanging the magnetic disk interface used by the host system.

What is claimed is:

1. A peripheral semiconductor memory system for coupling to a host system including a first and a second memory drive, comprising:
    a first flash EEPROM included in the first memory drive;
    a second flash EEPROM included in the second memory drive;
    host interface means for communicating with the host system, said host interface having registers for storing a logical address comprised of a drive number, a cylinder number, a head number, and a sector number; and
    means for controlling access to the first and second flash EEPROMs including an address converting means for converting a logical address from said host system into a physical address, according to first and second file management information which indicates correspondence between logical addresses and physical addresses of the first and second memory dives, respectively,
    said access controlling means further including memory accessing means, coupled to each of the first and second flash EEPROMs, for accessing a selected EEPROM corresponding to the converted physical address of said address converting means.

2. The semiconductor memory system according to claim 1, wherein the first memory drive stores the first file management information, and the second memory drive stores the second file management information.

3. The semiconductor memory system according to claim 1, further comprising a temporary memory, wherein the first and second file management information is stored in the temporary memory.

4. The semiconductor memory system according to claim 1, wherein the first and second EEPROMs and the access controlling means are mounted on a mother board in the host system.

5. The semiconductor memory system according to claim 4, wherein the first and second EEPROMs are first and second flash EEPROM chips;
    said semiconductor memory system further comprising slots for removing and connecting the first and second flash EEPROM chips to said mother board.

6. The semiconductor memory system according to claim 4, wherein the first and second EEPROMs are first and second flash EEPROM chips;
    said semiconductor memory system further comprising a slot for removing and connecting an additional flash EEPROM chip to said mother board.

7. The semiconductor memory system according to claim 6, said semiconductor memory system further comprising slots for removing and connecting the first and second flash EEPROM chips to said mother board.

8. A method of managing a semiconductor memory device having first and second drives managed by and coupled to a host system by a host interface, said host interface having registers for storing a logical address comprised of a drive number, a cylinder number, a head number, and a sector number so as to connect logical addresses to physical addresses and wherein the semiconductor memory device has a plurality of flash EEPROM chips and a controller for controlling the plurality of flash EEPROM chips in accordance with file management information in response to a request for access from the host system, comprising steps of:
    managing at least a first one of the plurality of flash EEPROM chips included in a memory area of the first drive, in accordance with first file management information indicating correspondence between the logical addresses and the physical addresses;
    managing at least a second one of the plurality of flash EEPROM chips included in a memory area of the second drive, in accordance with second file management information indicating correspondence between the logical addresses and the physical addresses; and
    selectively controlling the first and second drives according to the physical address converted from the logical address from the host system in accordance with the first file management information and the second file management information.

9. A method of claim 8, further comprising steps of:
    removing the at least first of the flash EEPROM chips included in the memory area of the first drive; and
    reformatting the memory area of the first drive.

10. A method of claim 8, further comprising the steps of:
    removing the at least first one of the flash EEPROM chips included in the memory area of the first drive;
    connecting a third flash EEPROM chip to the controller;
    managing the third flash EEPROM chip included in the first memory drive; and
    reformatting the memory area of the first drive.

11. A method of claim 8, wherein the semiconductor memory device has a slot, connected to the controller, and further comprises the steps of:
    displaying a message that the at least the first of said flash EEPROM chips has been rewritten more than a desired number of times:
    inserting a third flash EEPROM chip into the slot,
    copying data from a selected EEPROM chip included in the memory area of the first drive into the third flash EEPROM chip; and
    reassigning the third EEPROM chip included in the memory area of the first drive.

12. A method of claim 11, wherein the selected flash EEPROM chip has a rewrite counter for counting the number of times the selected flash EEPROM chip has been rewritten, further comprising the step of:
    rewriting a value of the rewrite counter to '0' in the third EEPROM chip.

13. A method of claim 8, further comprising the step of:
    indicating that the at least the first of said flash EEPROM chips has been rewritten more than a desired number of times;
    removing a selected one of at least a first one of the flash EEPROM chips included in the memory area of the first drive;
    installing a third flash EEPROM chip having a memory capacity greater than the selected one of the flash EEPROM chips; and assigning to the third flash EEPROM chip a replacement memory area substantially equal in capacity to the memory capacity of the selected one of the at least first one of the flash EEPROM chips, and an expansion memory area of the first drive having a capacity substantially equal to a remaining portion greater than the selected Dec. 5, 1995 third flash EEPROM chip.

14. A method of handling memory use in a peripheral semiconductor memory system having a first memory drive and a second memory drive, comprising the steps of:

managing the first memory drive in accordance with first file management information which indicates a correspondence between logical addresses comprised of a drive number, a cylinder number, a head number, and a sector number, and physical addresses of the first memory drive;

managing the second memory drive in accordance with second file management information which indicates a correspondence between logical addresses comprised of a drive number, a cylinder number, a head number, and a sector number, and physical addresses of the second memory drive;

converting in a common memory access controller a logical address from a host system into a physical address according to one of the first and second file management information; and accessing one of the first and second memory drives according to the physical address converted from the logical address.

15. A semiconductor memory system comprising:

flash EEPROM unit having a flash EEPROM cell array and peripheral logic for controlling the cell array;

a controller for controlling the flash EEPROM unit and an external flash EEPROM chip, coupled to a control line for transferring a memory command to the flash EEPROM unit, an input/output bus for transferring a memory address and data and a first select line for selecting the flash EEPROM unit;

a host interface for communicating with a host system said host interface having registers for storing a logical address comprised of a drive number, a cylinder number, a head number, and a sector number;

a command interface connected to the control line for communicating to the external flash EEPROM chip;

a data interface connected to the input/output bus for communicating to the external flash EEPROM chip; and a chip enable interface connected to a second select line for selecting the external flash EEPROM chip;

wherein, components of the memory system are configured as one package, and said controller controls the external flash EEPROM chip by selecting the second select line.

16. The semiconductor memory system according to claim 15, wherein, the semiconductor memory system is mounted on a mother board in the host system.

17. A semiconductor memory system comprising:

an external flash EEPROM chip;

a semiconductor disk, housed by one package, the semiconductor disk including:

a flash EEPROM unit having a flash EEPROM cell array and peripheral logic for controlling the cell array;

a controller for controlling the flash EEPROM unit and the external flash EEPROM chip coupled to a control line for transferring a memory command to the flash EEPROM unit, an input/output bus for transferring a memory address and data and a first select line for selecting the flash EEPROM unit;

a host interface for communicating to a host system said host interface having registers for storing a logical address comprised of a drive number, a cylinder number, a head number, and a sector number;

a command interface connected to the control line for communicating to the external flash EEPROM chip;

a data interface connected to the input/output bus for communicating to the external flash EEPROM chip; and a chip enable interface connected to a second select line for selecting the external flash EEPROM chip;

wherein a first memory block includes a memory area of the flash EEPROM unit and is managed in accordance with first file management information which indicates correspondence between logical addresses and physical addresses;

wherein a second memory block includes a memory area of the external flash EEPROM chip and is managed in accordance with second file management information which indicates correspondence between physical addresses and logical addresses;

means for controlling access to the flash EEPROM unit and external flash EEPROM chip including an address converting means which converts a logical address from the host system into a physical address, according to one of the first file management information and the second management information;

the access controlling means further including memory accessing means, coupled to the flash EEPROM unit and the external flash EEPROM chip, for accessing a selected EEPROM according to the physical address from said address converting means.

18. The semiconductor memory system according to claim 17, further including a second external flash EEPROM chip, wherein the first memory block further includes a memory area of the second external flash EEPROM chip.

19. A semiconductor memory system provided as a secondary memory for a host computer, comprising:

a plurality of flash EEPROM chips;

a controller connected to each of the flash EEPROM chips for controlling each of the flash EEPROM chips, according to requests for disk access from a host system;

a host interface for communicating with the host system, said interface having registers for storing a logical address comprised of a drive number, a cylinder number, a head number, and a sector number; and wherein the semiconductor memory system is mountable on a mother board of the host system.

20. The semiconductor memory system according to claim 19, further comprising a plurality of slots connected to the controller, for connecting to the controller the plurality of flash EEPROM chip.

21. The semiconductor memory system according to claim 20, further comprising a controller slot directly connected to the host system.

22. The semiconductor memory system according to claim 21, further comprising an ID signal line, for indicating whether the host system is connected to the controller.

* * * * *